US012598756B2

(12) United States Patent
Trinh et al.

(10) Patent No.: US 12,598,756 B2
(45) Date of Patent: Apr. 7, 2026

(54) PHASE CHANGE MATERIAL (PCM) SWITCH HAVING LOW HEATER RESISTANCE

(71) Applicant: Taiwan Semiconductor Manufacturing Company, Ltd., Hsinchu (TW)

(72) Inventors: Hai-Dang Trinh, Hsinchu (TW); Fu-Ting Sung, Yangmei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 475 days.

(21) Appl. No.: 18/149,274

(22) Filed: Jan. 3, 2023

(65) Prior Publication Data

US 2024/0099022 A1    Mar. 21, 2024

Related U.S. Application Data

(60) Provisional application No. 63/408,205, filed on Sep. 20, 2022.

(51) Int. Cl.
  H10B 63/10  (2023.01)
(52) U.S. Cl.
  CPC .................................. H10B 63/10 (2023.02)

(58) Field of Classification Search
  CPC .. H10B 63/10; H10N 70/823; H10N 70/8613; H10N 70/8828; H10N 70/8833; H10N 79/00; H10N 70/231
  See application file for complete search history.

(56) References Cited

U.S. PATENT DOCUMENTS

2023/0337554 A1 * 10/2023 Wohlmuth ......... H10N 70/8613

OTHER PUBLICATIONS

C.R. Nave. "Electrical Conductivity and Resistivity at 295K" Georgetown University, published in 2016.

* cited by examiner

*Primary Examiner* — Tucker J Wright
(74) *Attorney, Agent, or Firm* — Eschweiler & Potashnik, LLC

(57) ABSTRACT

Various embodiments of the present application are directed toward an integrated chip (IC). The IC comprises a dielectric structure disposed over a substrate. A phase change material (PCM) structure is disposed over the dielectric structure. A first conductive structure and a second conductive structure are disposed over and electrically coupled to the PCM structure. A heating structure is disposed in the dielectric structure and laterally between the first conductive structure and the second conductive structure. The heating structure has a first surface and a second surface opposite the first surface. The first surface faces the PCM structure. The first surface has a first width and the second surface has a second width that is greater than the first width.

20 Claims, 30 Drawing Sheets

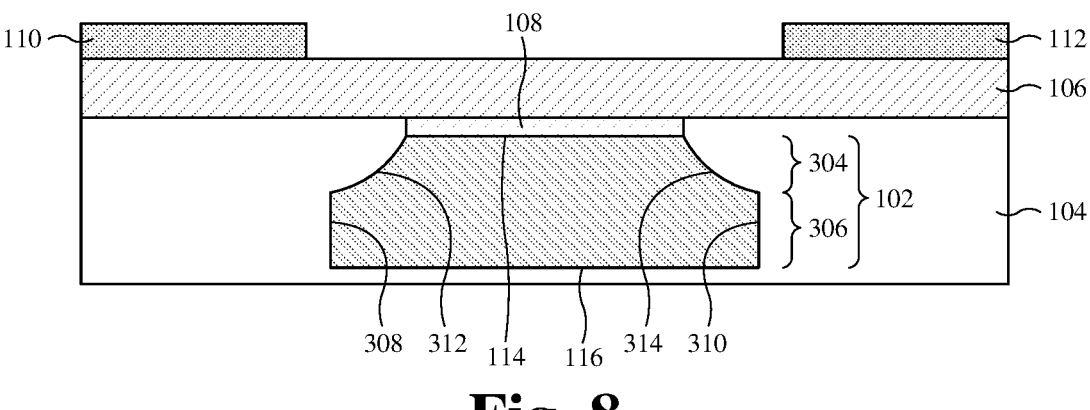
Fig. 8
Fig. 9

1806
1804
1802
104a 1910
1908
1902
1904
1906
104a

2000

1902
1904
1906
2002
104a

2100

2108
2106
2102
2104
108
102
104a

2600

1902
1904
2502
502
2002
104a
2504

2700

2108
2106
2102
108
2104
2702
304
502
102
2504
306
104a

3000

— 1806
— 1804

— 1802
— 104a

3100

} 3104

— 3103
— 2104
— 108

— 3102
— 104a

3600

3700

3800

5300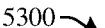

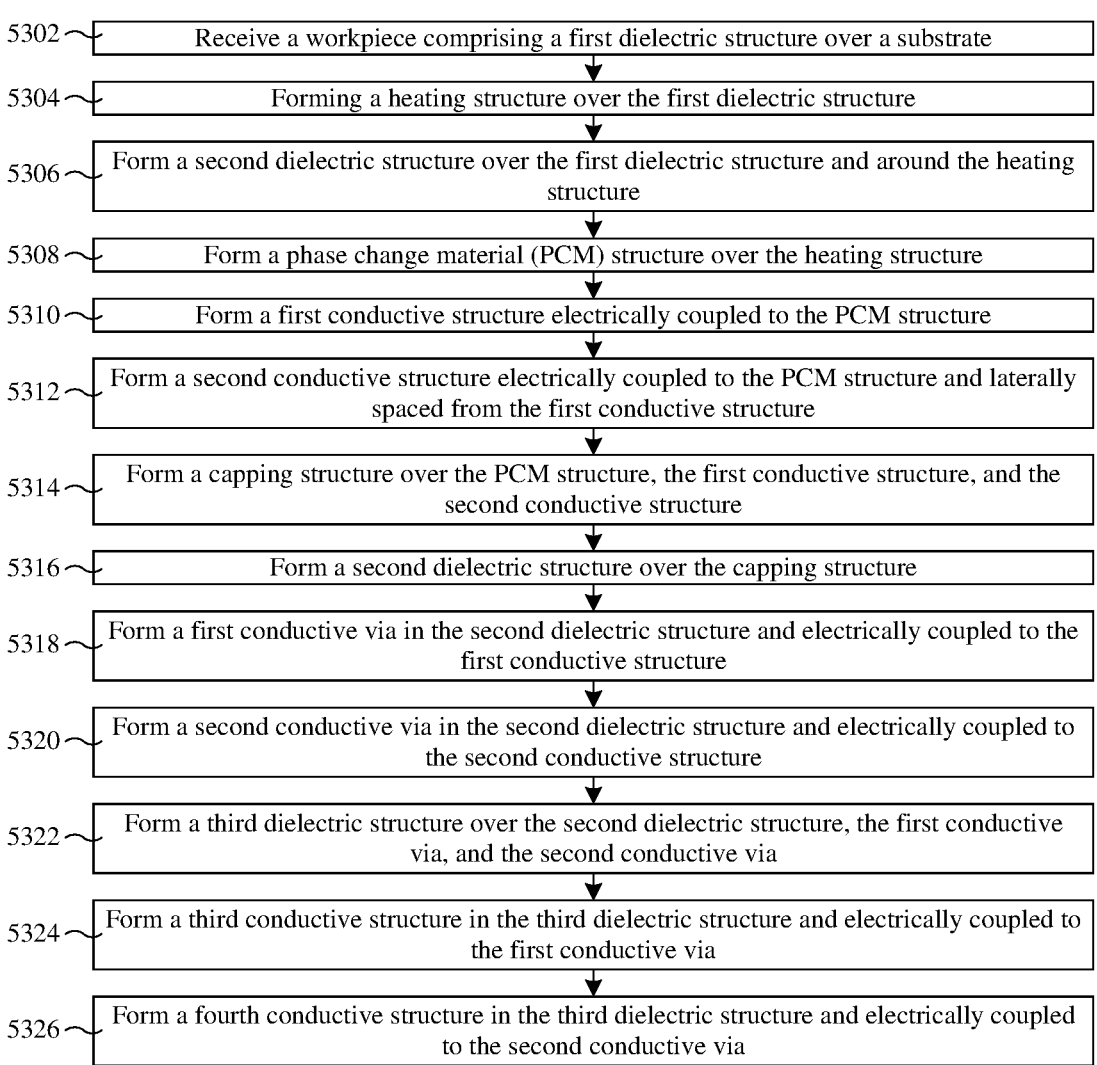

5302 — Receive a workpiece comprising a first dielectric structure over a substrate 5304 — Forming a heating structure over the first dielectric structure 5306 — Form a second dielectric structure over the first dielectric structure and around the heating structure 5308 — Form a phase change material (PCM) structure over the heating structure 5310 — Form a first conductive structure electrically coupled to the PCM structure 5312 — Form a second conductive structure electrically coupled to the PCM structure and laterally spaced from the first conductive structure 5314 — Form a capping structure over the PCM structure, the first conductive structure, and the second conductive structure 5316 — Form a second dielectric structure over the capping structure 5318 — Form a first conductive via in the second dielectric structure and electrically coupled to the first conductive structure 5320 — Form a second conductive via in the second dielectric structure and electrically coupled to the second conductive structure 5322 — Form a third dielectric structure over the second dielectric structure, the first conductive via, and the second conductive via 5324 — Form a third conductive structure in the third dielectric structure and electrically coupled to the first conductive via 5326 — Form a fourth conductive structure in the third dielectric structure and electrically coupled to the second conductive via

Fig. 53

PHASE CHANGE MATERIAL (PCM) SWITCH HAVING LOW HEATER RESISTANCE

REFERENCE TO RELATED APPLICATION

This application claims the benefit of U.S. Provisional Application No. 63/408,205, filed on Sep. 20, 2022, the contents of which are incorporated herein by reference in their entirety.

BACKGROUND

Modern day integrated circuits (ICs) comprise millions or billions of semiconductor devices formed on a semiconductor substrate (e.g., silicon). ICs may use many different types of transistor devices, depending on application. In recent years, the increasing market for cellular and radio frequency (RF) devices has resulted in a significant increase in the demand for RF switch devices. For example, a smartphone may incorporate ten or more RF switch devices to switch a received signal to appropriate bands.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 illustrates a cross-sectional view of some other embodiments of the PCM switch having low heater resistance.

FIG. 9 illustrates a cross-sectional view of some other embodiments of the PCM switch having low heater resistance.

FIG. 53 illustrates a flowchart of some embodiments of a method for forming an IC comprising a PCM switch having low heater resistance.

DETAILED DESCRIPTION

Figures 1, 2:
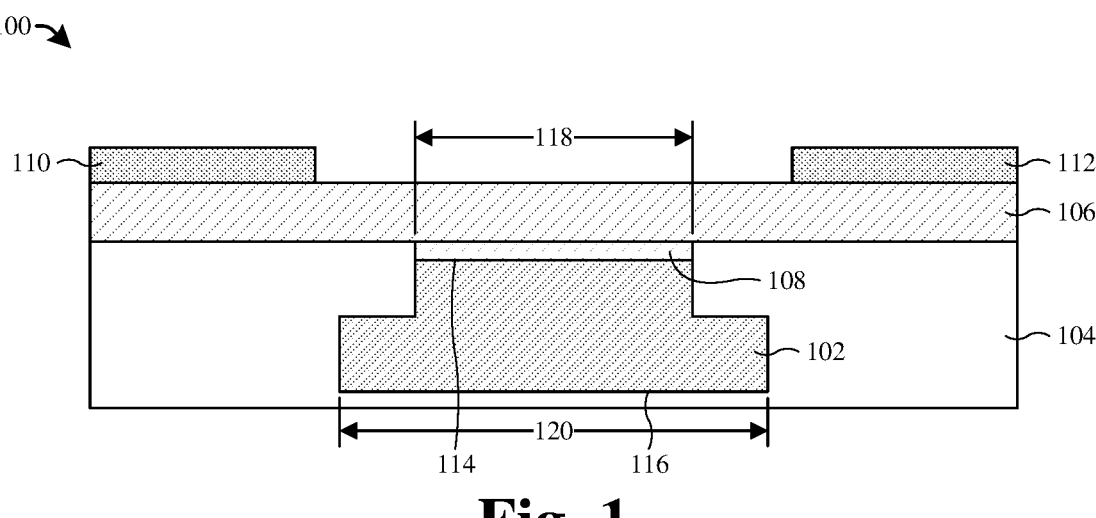
FIG. 1 illustrates a cross-sectional view of some embodiments of a phase change material (PCM) switch having low heater resistance.
FIG. 2 illustrates a cross-sectional view of some other embodiments of the PCM switch having low heater resistance.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a phase change material (PCM) switch comprises a first conductive structure, a second conductive structure, and a PCM structure (or a portion of a PCM structure) laterally between the first conductive structure and the second conductive structure. The PCM switch may further comprise a heating structure disposed beneath the PCM structure. The heating structure is typically disposed in a dielectric structure. The heating structure is configured to heat the PCM structure. By heating the PCM structure based on predefined methods, the PCM structure may be selectively switched between a high-resistive state (e.g., "OFF" state of the PCM switch) and a low-resistive state (e.g., "ON" state of the PCM switch).

In some embodiments, the resistive state (e.g., high-resistive state or low-resistive state) of the PCM structure is based on a phase of the PCM structure. For example, the PCM structure may be in the high-resistive state when the PCM structure has a first phase (e.g., an amorphous phase), and the PCM structure may be in the low-resistive state when the PCM structure has a second phase (e.g., a crystalline phase). In further embodiments, the phase of the PCM structure may be switched between the first phase and the second phase based on the predefined methods. For example, a first predefined method (e.g., slow heating and slow cooling) that comprises heating the PCM structure to a first temperature (e.g., the crystalline temperature of the material of the PCM structure) may switch the phase of the PCM structure from the first phase to the second phase, and a second predefined method (e.g., fast heating and fast cooling) that comprises heating the PCM structure to a second temperature (e.g., the melting point of the material of the PCM structure) may switch the phase of the PCM structure from the second phase to the first phase.

A typical heating structure of a typical PCM switch generally has a rectangular-shaped profile (e.g., the typical heating structure has a rectangular shape when viewed along a cross-sectional view). Further, the first and second conductive structures of the typical heating structure are generally spaced apart by a lateral distance that is measured along a lateral plane. Moreover, the rectangular-shaped profile is taken along the lateral plane (e.g., the cross-sectional view in which the typical heating structure has the rectangular shape is taken along the lateral plane). One challenge with the typical PCM switch is that the typical heating structure has a relatively high electrical resistance (e.g., electrical resistance of the heating structure). As such, relatively high voltages are needed (e.g., applied to the typical heating structure) for the typical heating structure to generate enough power to heat the PCM structure to the first and second temperatures.

A first possible solution to reduce the electrical resistance of the typical heating structure is to maintain both the lateral distance (between the first and second conductive structures) and the rectangular-shaped profile, while increasing a width of the typical heating structure (e.g., increase the width of the rectangular-shaped profile). However, such a solution greatly increases $C_{OFF}$ (e.g., capacitance of a PCM switch in the "OFF" state) while maintaining $R_{ON}$ (e.g., resistance of the PCM switch in the "ON" state). Thus, the first possible solution may reduce device performance of the PCM switch (e.g., increased $R_{ON}$–$C_{OFF}$, which is equal to the product of $R_{ON}$ times $C_{OFF}$).

A second possible solution to reduce the electrical resistance of the typical heating structure is to maintain the rectangular-shaped profile, while increasing both the lateral distance (between the first and second conductive structures) and the width of the typical heating structure. However, such a solution greatly increases RO N while maintaining $C_{OFF}$.

Thus, the second possible solution also may reduce the device performance of the PCM switch (e.g., increased $R_{ON}$–$C_{OFF}$).

A third possible solution to reduce the electrical resistance of the typical heating structure is to maintain the rectangular-shaped profile, maintain the lateral distance (between the first and second conductive structures), and maintain the width of the typical heating structure, while increasing a height of the typical heating structure (e.g., increase the height of the rectangular-shaped profile). However, increasing the height of the typical heating structure is limited due to a maximum height of the dielectric structure in which the typical heating structure is disposed in (e.g., a maximum height of an interlayer dielectric (ILD) layer is limited due to requirements of other devices (e.g., interconnect lengths for logic devices)). Further, increasing the height while maintaining the other parameters may cause peeling issues between the PCM structure and the heating structure (e.g., due to the increase in height causing higher stress(es)). Thus, the third possible solution may be limited due to a maximum chip height and/or negatively impacting yield and/or negatively impacting product lifespan (e.g., the peeling issues may reduce yield and/or may reduce a number of times the PCM switch may switch between resistive states).

Various embodiments of the present application are directed toward a PCM switch having low heater resistance. The PCM switch comprises a first conductive structure, a second conductive structure, and a PCM structure disposed laterally between the first conductive structure and the second conductive structure. The PCM switch also comprises a heating structure disposed laterally between the first conductive structure and the second conductive structure. In some embodiments, the PCM structure overlies the heating structure. In other embodiments, the heating structure overlies the PCM structure. The heating structure has a first surface (e.g., an upper surface) and a second surface (e.g., a lower surface) opposite the first surface. The first surface faces the PCM structure, and the second surface faces away from the PCM structure. The first surface has a first width and the second surface has a second width that is greater than the first width.

Because the first surface has the first width and the second surface has the second width, the heating structure may have a lower electrical resistance than a typical heating structure (e.g., a rectangular-shaped heater). For example, because the first surface has the first width and the second surface has the second width, the heating structure of the present disclosure may have a first portion (disposed near the first surface) that has a third width, and the heating structure of the present disclosure may have a second portion (disposed near the second surface) that has a fourth width greater than the first width. Because the second portion of the heating structure is wider than the first portion of the heating structure, an area (e.g., cross-sectional area when viewed along the cross-sectional view) of the heating structure may be increased (e.g., by increasing a width and/or a height) while significantly limiting an increase in $C_{OFF}$. An increase in the area of the heating structure may reduce the electrical resistance of the heating structure (e.g., electrical resistance of the heating structure is inversely proportional to the cross-sectional area of the heating structure). In some embodiments, the width of the area of the heating structure may be increased (while significantly limiting an increase in $C_{OFF}$) due to an increase in the width of the second portion of the heating structure (in relation to a width of the first portion).

By increasing the width of the second portion of the heating structure, any potential increase in $C_{OFF}$ may be significantly limited due to the portion of $C_{OFF}$ that corresponds to the second portion of the heating structure being based on a dielectric layer having a lower relative permittivity. For example, in some embodiments, the heating structure may be disposed in a dielectric structure. By increasing the width of the second portion of the heating structure (in relation to a width of the first portion), a larger portion of the dielectric structure may be disposed between the heating structure and the first conductive structure and a larger portion of the dielectric structure may be disposed between the heating structure and the second conductive structure. The dielectric structure may have a lower relative permittivity than the PCM structure (e.g., the relative permittivity of silicon dioxide ($SiO_2$) is about 3.8, whereas the relative permittivity of germanium telluride (GeTe) is about 37.5). Thus, the portion of $C_{OFF}$ that corresponds to the second portion of the heating structure (e.g., a capacitance between the second portion of the heating structure and the first (and second) conductive structures) is based on a larger portion of a material that has a lower relative permittivity. As such, any potential increase in $C_{OFF}$ may be significantly limited.

Accordingly, relatively low voltages may be needed (e.g., applied to the heating structure) for the heating structure of the present disclosure to generate enough power to switch the phase of the PCM structure (e.g., switch between the first and second phases). As such, in comparison to a typical PCM switch, the PCM switch of the present disclosure may have improved device performance (e.g., lower power consumption, lower operating voltages, etc.).

FIG. 1 illustrates a cross-sectional view 100 of some embodiments of a phase change material (PCM) switch having low heater resistance. It will be appreciated that PCM switch may be disposed on an integrated chip (IC).

As shown in the cross-sectional view 100 of FIG. 1, a first heating structure 102 is disposed in a first dielectric structure 104. A phase change material (PCM) structure 106 is disposed on a side of the first heating structure 102 and on a side of the first dielectric structure 104. For example, the PCM structure 106 is disposed over the side of the first heating structure 102 and over the side of the first dielectric structure 104. In some embodiments, a relative permittivity of the first dielectric structure 104 is less than a relative permittivity of the PCM structure 106.

In some embodiments, a first insulator structure 108 is disposed vertically between the first heating structure 102 and the PCM structure 106. In further embodiments, the first insulator structure 108 may be disposed over the first heating structure 102.

A first conductive structure 110 is disposed on the side of the first dielectric structure 104 (and the side of the first heating structure 102), and the PCM structure 106 is disposed vertically between the first conductive structure 110 and the first dielectric structure 104. For example, the first conductive structure 110 is disposed over the first dielectric structure 104 and the PCM structure 106. The first conductive structure 110 is electrically coupled to the PCM structure 106.

A second conductive structure 112 is disposed on the side of the first dielectric structure 104 (and the side of the first heating structure 102), and the PCM structure 106 is disposed vertically between the second conductive structure 112 and the first dielectric structure 104. For example, the second conductive structure 112 is disposed over the first dielectric structure 104 and the PCM structure 106. The second conductive structure 112 is electrically coupled to the PCM structure 106. The second conductive structure 112 is laterally spaced from the first conductive structure 110. The first heating structure 102 is disposed laterally between the first conductive structure 110 and the second conductive structure 112. The PCM structure 106 is disposed vertically between the first heating structure 102 and the first conductive structure 110 and vertically between the first heating structure 102 and the second conductive structure 112.

The PCM structure 106 is configured to change between a first resistive state (e.g., a high-resistive state) and a second resistive state (e.g., a low-resistive state) that is different than the first resistive state. In some embodiments, the first resistive state corresponds to an "OFF" state of the PCM switch (e.g., the PCM switch is "open" and current may not (easily) flow between the first conductive structure 110 and the second conductive structure 112). In further embodiments, the first resistive state corresponds to an "ON" state of the PCM switch (e.g., the PCM switch is "closed" and current may (easily) flow between the first conductive structure 110 and the second conductive structure 112).

The PCM structure 106 is configured to change between the first and second resistive states by changing between different phases. For example, the PCM structure 106 may be in the first resistive state when the PCM structure 106 has a first phase (e.g., an amorphous phase), and the PCM structure may be in the second resistive state when the PCM structure 106 has a second phase (e.g., a crystalline phase). More specifically, in some embodiments, when a portion of the PCM structure 106 disposed between the first conductive structure 110 and the second conductive structure 112 is in an amorphous phase (e.g., the portion of the PCM structure 106 is an amorphous solid), the PCM structure 106 may be in the first resistive state; and when the portion of the PCM structure 106 disposed between the first conductive structure 110 and the second conductive structure 112 is in a crystalline phase (e.g., the portion of the PCM structure 106 is a crystalline solid), the PCM structure 106 may be in the second resistive state.

The first heating structure 102 is configured to heat the PCM structure 106. By heating the PCM structure 106 (via the first heating structure 102) based on predefined methods, the phase of the PCM structure 106 may be selectively changed between the first phase and the second phase. For example, a first predefined method (e.g., slow heating and slow cooling) that comprises heating the PCM structure 106 to a first temperature (e.g., the crystalline temperature of the material of the PCM structure 106) may switch the phase of the PCM structure 106 from the first phase to the second phase, and a second predefined method (e.g., fast heating and fast cooling) that comprises heating the PCM structure 106 to a second temperature (e.g., the melting point of the material of the PCM structure 106) may switch the phase of the PCM structure 106 from the second phase to the first phase. As such, by heating the PCM structure 106 (via the first heating structure 102) based on the predefined methods, the PCM structure 106 may be selectively switched between the first resistive state and the second resistive state. Accordingly, the PCM switch may be selectively switched between the "OFF" state and the "ON" state.

The first heating structure 102 has a first surface 114 and a second surface 116 that is opposite the first surface 114. The first surface 114 faces the PCM structure 106. The second surface 116 faces away from the PCM structure 106. The first surface 114 has a first width 118. The second surface 116 has a second width 120 that is greater than the first width 118. In some embodiments, the first heating structure 102 has a T-shaped profile, as shown in the cross-sectional view 100 of FIG. 1.

Because the first surface 114 has the first width 118 and the second surface 116 has the second width 120, the first heating structure 102 may have a lower electrical resistance than a typical heating structure (e.g., a rectangular-shaped heater). For example, because the first surface 114 has the first width 118 and the second surface 116 has the second width 120, the first heating structure 102 has a first portion (disposed along the first surface 114) that has a third width (e.g., about the same as the first width 118), and the first heating structure 102 has a second portion (disposed along the second surface 116) that has a fourth width (e.g., about the same as the second width 120) that is greater than the third width. Because the second portion of the first heating structure 102 is wider than the first portion of the first heating structure 102, an area (e.g., the cross-sectional area of the first heating structure 102 as seen in the cross-sectional view 100 of FIG. 1) of the first heating structure 102 may be greater than a corresponding area of the typical heating structure, while having a substantially similar $C_{OFF}$ (e.g., capacitance of the PCM switch in the "OFF" state) as a typical PCM switch comprising the typical heating structure. An increase in the area of the first heating structure 102 may reduce the electrical resistance of the first heating structure 102 (e.g., the electrical resistance of the first heating structure is inversely proportional to the cross-sectional area of the first heating structure 102). Thus, the first heating structure 102 may have a lower electrical resistance than the typical heating structure (e.g., a lower $R_{ON}$).

In some embodiments, the width of the area of the first heating structure 102 may be greater than the typical heating structure (while having a substantially similar $C_{OFF}$) due to an increase in the width of the second portion of the first heating structure 102 (in relation to a width of the first portion). Because the second portion of the first heating structure 102 is wider than the first portion of the first heating structure 102, any potential increase in $C_{OFF}$ (due to the overall larger width of the first heating structure 102 in comparison to the typical heating structure) may be significantly limited due to more of the portion of $C_{OFF}$ that corresponds to the second portion of the first heating structure 102 being based on a relative permittivity of the first dielectric structure 104 (rather than a relative permittivity of the PCM structure 106).

For example, as shown in the cross-sectional view 100 of FIG. 1, the first heating structure 102 is disposed in the first dielectric structure 104. Because the width of the second portion of the first heating structure 102 is greater than the width of the first portion of the first heating structure 102, a relatively large portion of the first dielectric structure 104 may be disposed between the second portion of the first heating structure 102 and the first conductive structure 110 and a relatively large portion of the first dielectric structure 104 may be disposed between the second portion of the first heating structure 102 and the second conductive structure 112. The first dielectric structure 104 may have a lower relative permittivity than the PCM structure 106 (e.g., the relative permittivity of silicon dioxide ($SiO_2$) is about 3.8, whereas the relative permittivity of germanium telluride (GeTe) is about 37.5). Thus, the portion of $C_{OFF}$ that corresponds to the second portion of the first heating structure 102 (e.g., a capacitance between the second portion of the first heating structure and the first (and second) conductive structures) is based on a larger portion of a material that has a lower relative permittivity. As such, any potential increase in $C_{OFF}$ may be significantly limited due to the first surface 114 having the first width 118 and the second surface 116 having the second width 120.

Accordingly, in comparison to a typical heating structure, relatively low voltages may be needed (e.g., applied to the first heating structure 102) for the first heating structure 102 to generate enough power to switch the phase of the PCM structure 106 (e.g., switch between the first and second phases). As such, in comparison to a typical PCM switch, the PCM switch of the present disclosure may have improved device performance (e.g., lower power consumption, lower operating voltages, lower $R_{ON}$–$C_{OFF}$, etc.).

FIG. 2 illustrates a cross-sectional view 200 of some other embodiments of the PCM switch having low heater resistance.

As shown in the cross-sectional view 200 of FIG. 2, the first heating structure 102 is disposed in a second dielectric structure 202 and laterally between the first conductive structure 110 and the second conductive structure 112. The PCM structure 106 is disposed on a side of the first heating structure 102 and on a side of the first dielectric structure 104. For example, the PCM structure 106 is disposed beneath the side of the first heating structure 102 and beneath the side of the first dielectric structure 104.

The PCM structure 106 is disposed vertically between the second dielectric structure 202 and the first dielectric structure 104. In some embodiments, the second dielectric structure 202 is disposed over the PCM structure 106 and the first dielectric structure 104. In some embodiments, the first insulator structure 108 may be disposed beneath the first heating structure 102.

The first conductive structure 110 is disposed on the side of the second dielectric structure 202 (and the side of the first heating structure 102), and the PCM structure 106 is disposed vertically between the first conductive structure 110 and the second dielectric structure 202. For example, the first conductive structure 110 is disposed beneath the second dielectric structure 202 and the PCM structure 106. The second conductive structure 112 is disposed on the side of the second dielectric structure 202 (and the side of the first heating structure 102), and the PCM structure 106 is disposed vertically between the second conductive structure 112 and the second dielectric structure 202. For example, the second conductive structure 112 is disposed beneath the second dielectric structure 202 and the PCM structure 106. In some embodiments, the first conductive structure 110 and the second conductive structure 112 are disposed in the first dielectric structure 104.

In some embodiments, the first dielectric structure 104 comprises one or more stacked dielectric layers, which may respectively comprise an oxide (e.g., silicon dioxide ($SiO_2$)), a low-k dielectric (e.g., a dielectric material with a dielectric constant less than about 3.9), or the like. In further embodiments, the first dielectric structure 104 may be a first interlayer dielectric (ILD) structure, and the one or more stacked dielectric layers may be one or more stacked ILD layers. In further embodiments, the second dielectric structure 202 comprises one or more stacked dielectric layers, which may respectively comprise an oxide (e.g., $SiO_2$), a low-k dielectric, or the like. In further embodiments, the second dielectric structure 202 may be a second ILD structure, and the one or more stacked dielectric layers may be one or more stacked ILD layers.

In some embodiments, the PCM structure 106 may be or comprise, for example, germanium telluride (GeTe), germanium antimony telluride (GeSbTe), vanadium oxide ($VO_2$), some other material capable of changing resistive states by changing phases, or a combination of the foregoing. In some embodiments, the first insulator structure 108 may be or comprise, for example, an oxide (e.g., $SiO_2$), a nitride (e.g., silicon nitride (SiN)), a carbide (e.g., silicon carbide (SiC)), a carbonitride (e.g., silicon carbonitride (SiCN)), a metal nitride (e.g., aluminum nitride (AlN)), carbon (C), some other insulating material, or a combination of the foregoing. In further embodiments, a chemical composition of the first insulator structure 108 may be different than a chemical composition of the second dielectric structure 202 and/or a chemical composition of the first dielectric structure 104 (e.g., the first insulator structure 108 is or comprises a different material(s) than the second dielectric structure 202). In other embodiments, the chemical composition of the first insulator structure 108 may be the same as the chemical composition of the second dielectric structure 202 and/or the chemical composition of the first dielectric structure 104 (e.g., the first insulator structure 108 is or comprises a same material(s) as the second dielectric structure 202).

In some embodiments, the first conductive structure 110 may be or comprise, for example, a metal (e.g., tungsten (W), copper (Cu), gold (Au), silver (Ag), or the like), a metal nitride (e.g., titanium nitride (TiN), tantalum nitride (TaN), or the like), some other conductive material, or a combination of the foregoing. In some embodiments, the second conductive structure 112 may be or comprise, for example, a metal (e.g., tungsten (W), copper (Cu), gold (Au), silver (Ag), or the like), a metal nitride (e.g., TiN, TaN, or the like), some other conductive material, or a combination of the foregoing. In further embodiments, the first conductive structure 110 and the second conductive structure 112 may have a same chemical composition (e.g., be or comprise the same material(s)).

In some embodiments, the first heating structure 102 may be or comprise, for example, a metal (e.g., tungsten (W), iridium (Jr), ruthenium (Ru), platinum (Pt), gold (Au), or the like), a metal nitride (e.g., TiN), some other conductive material, or a combination of the foregoing (e.g., a combination of tungsten (W) and TiN). In further embodiments, the first heating structure 102 has a melting temperature greater than or equal to about 1000° C. In further embodiments, the first heating structure 102 has a resistivity that is less than or equal to about $10.4 \times 10^{-8}$ ohm-meter.

In some embodiments, the first surface 114 is substantially planar (e.g., substantially planar includes small variations caused by fabrication process(es)). In some embodiments, the second surface 116 is substantially planar. In further embodiments, the first surface 114 and the second surface 116 extend laterally in parallel with one another. As shown in the cross-sectional view 200 of FIG. 2, the first heating structure 102 may have a T-shaped profile.

In some embodiments, the first width 118 is between about 0.1 micrometer (µm) and about 10 µm. In further embodiments, the first width 118 is between about 1 µm and about 2 µm. In further embodiments, if the first width 118 is less than about 1 µm, the first heating structure 102 may not be able to provide sufficient heat to the PCM structure 106 to switch the phase of the PCM structure 106. In further embodiments, if the first width 118 is greater than about 2 µm, the $C_{OFF}$ of the PCM switch may be negatively impacted (e.g., greater than a maximum $C_{OFF}$ specification).

In some embodiments, the second width 120 is between about 0.2 µm and about 20 µm. In further embodiments, the second width 120 is between about 1.5 µm and about 4 µm. In further embodiments, if the second width 120 is less than about 1.5 µm, the voltage needed (e.g., applied to the first heating structure 102) for the first heating structure 102 to generate enough power to switch the phase of the PCM structure 106 may be too large (e.g., greater than a maximum voltage specification). In further embodiments, if the second width 120 is greater than about 4 µm, the $C_{OFF}$ of the PCM switch may be negatively impacted (e.g., greater than a maximum $C_{OFF}$ specification).

Figure 3:
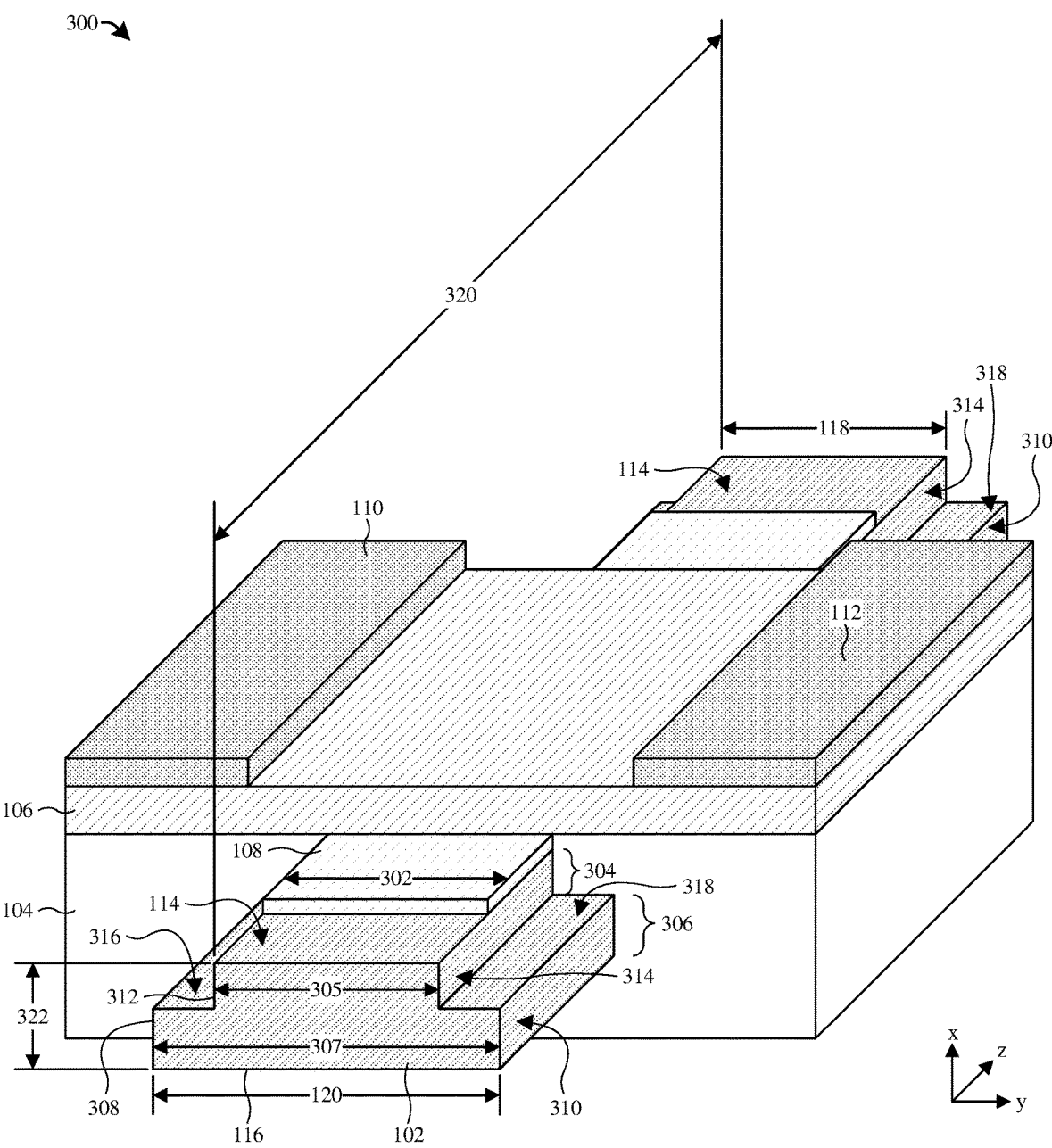
FIG. 3 illustrates a perspective view of some embodiments of the PCM switch having low heater resistance.

FIG. 3 illustrates a perspective view 300 of some embodiments of the PCM switch having low heater resistance.

As shown in the perspective view 300 of FIG. 3, the first insulator structure 108 has a width 302. In some embodiments, the width 302 is substantially the same as the first width 118.

Also shown in the perspective view 300 of FIG. 3, the first heating structure 102 has a first portion 304 and a second portion 306. The first portion 304 is disposed vertically between the second portion 306 and the PCM structure 106. In some embodiments, the first portion 304 is disposed vertically between the second portion 306 and the first insulator structure 108. In further embodiments, the first surface 114 may define a surface (e.g., upper surface) of the first portion 304. In further embodiments, the second surface 116 may define a first surface (e.g., lower surface) of the second portion 306.

The first portion 304 has a third width 305. The second portion 306 has a fourth width 307. The fourth width 307 is greater than the third width 305. In some embodiments, the third width 305 is substantially the same as the first width 118. In some embodiments, the fourth width 307 is substantially the same as the second width 120.

The second portion 306 has a first sidewall 308 and a second sidewall 310. The first sidewall 308 is opposite the second sidewall 310. The first sidewall 308 and the second sidewall 310 are laterally spaced apart (along the y-plane) by a first distance. In some embodiments, the first distance is equal to the fourth width 307. In some embodiments, the first sidewall 308 is substantially vertical (e.g., extends along the y-plane in a substantially straight line). In further embodiments, the second sidewall 310 is substantially vertical. In other embodiments, the first sidewall 308 and/or the second sidewall 310 may be angled (inward or outward). In yet other embodiments, the first sidewall 308 and/or the second sidewall 310 may be rounded (inward or outward).

The first portion 304 has a first sidewall 312 and a second sidewall 314. The first sidewall 312 is opposite the second sidewall 314. The first sidewall 312 and the second sidewall 314 are laterally spaced apart (along the y-plane) by a second distance that is less than the first distance. In some embodiments, the second distance is equal to the third width 305. In some embodiments, the first sidewall 312 is substantially vertical (e.g., extends along the y-plane in a substantially straight line). In further embodiments, the second sidewall 314 is substantially vertical. In other embodiments, the first sidewall 312 and/or the second sidewall 314 may be angled (inward or outward). In yet other embodiments, the first sidewall 312 and/or the second sidewall 314 may be rounded (inward or outward).

In some embodiments, the first heating structure 102 has a third surface 316 (e.g., an upper surface). The third surface 316 is disposed vertically between the first surface 114 and the second surface 116. The first sidewall 308 extends vertically from the second surface 116 to the third surface 316. In some embodiments, the first sidewall 308 extends continuously vertically from the second surface 116 to the third surface 316. The first sidewall 312 extends vertically from the third surface 316 to the first surface 114. In some embodiments, the first sidewall 312 extends continuously vertically from the third surface 316 to the first surface 114.

In some embodiments, the first heating structure 102 has a fourth surface 318 (e.g., an upper surface). The fourth surface 318 is disposed vertically between the first surface 114 and the second surface 116. The second sidewall 310 extends vertically from the second surface 116 to the fourth surface 318. In some embodiments, the second sidewall 310 extends continuously vertically from the second surface 116 to the fourth surface 318. The second sidewall 314 extends vertically from the fourth surface 318 to the first surface 114. In some embodiments, the second sidewall 314 extends continuously vertically from the fourth surface 318 to the first surface 114.

In some embodiments, the first surface 114 extends laterally (along the z-plane) in parallel with the second surface 116. In further embodiments, the third surface 316 extends laterally (along the z-plane) in parallel with both the first surface 114 and the second surface 116. In further embodiments, the fourth surface 318 extends laterally (along the z-plane) in parallel with both the first surface 114 and the second surface 116. In yet further embodiments, the third surface 316 and the fourth surface 318 are coplanar.

The first heating structure 102 has a length 320 (e.g., a distance along the z-plane between opposite sidewalls of the first heating structure 102). In some embodiments, the length 320 is between about 1 μm and about 60 μm. In further embodiments, the length 320 is between about 3 μm and about 6 μm. In further embodiments, if the length 320 is less than about 3 μm, the first heating structure 102 may not be able to provide sufficient heat to the PCM structure 106 to switch the phase of the PCM structure 106. In further embodiments, if the length 320 is greater than about 6 μm, the voltage needed (e.g., applied to the first heating structure 102) for the first heating structure 102 to generate enough power to switch the phase of the PCM structure 106 may be too large (e.g., greater than a maximum voltage specification).

The first heating structure 102 has a height 322. The height 322 may be between about 10 angstroms (Å) and 10,000 Å. In some embodiments, the height 322 may be between about 1,000 Å and about 2,500 Å. In further embodiments, if the height 322 is less than about 1,000 Å, the voltage needed (e.g., applied to the first heating structure 102) for the first heating structure 102 to generate enough power to switch the phase of the PCM structure 106 may be too large (e.g., greater than a maximum voltage specification). In further embodiments, if the height 322 is greater than about 2,500 Å, peeling issues may arise between the PCM structure 106 and the first heating structure 102.

To better illustrate some features of the PCM switch of FIG. 3, some of the features of the PCM switch illustrated in FIG. 3 are longer and/or shorter than they may be in other embodiments. For example, as shown in the perspective view 300 of FIG. 3, a length (e.g., distance along the z-plane) of the first insulator structure 108 is less than the length 320 of the first heating structure 102 to better illustrate the first surface 114. In other embodiments, the length of the first insulator structure 108 may be substantially the same as the length 320.

Figure 4:
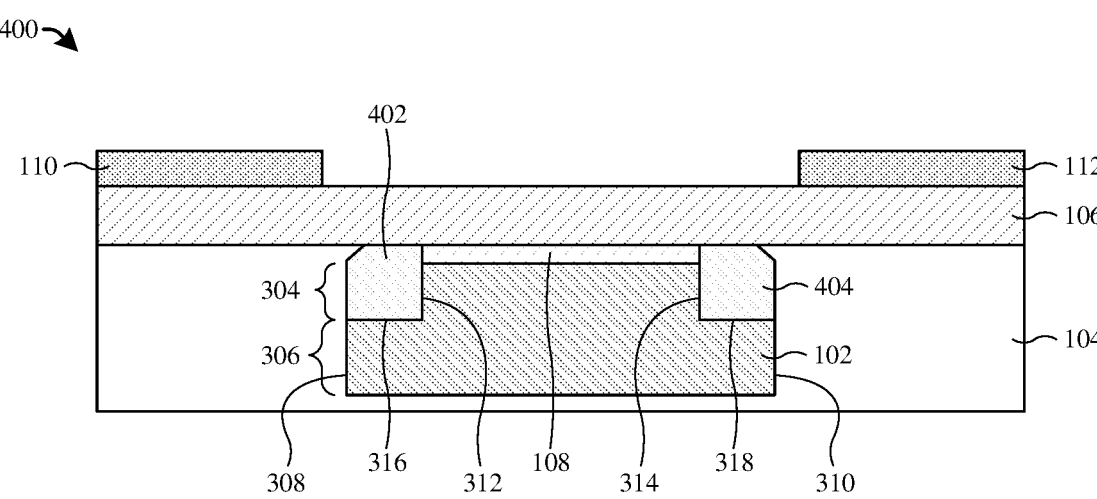
FIG. 4 illustrates a cross-sectional view of some other embodiments of the PCM switch having low heater resistance.

FIG. 4 illustrates a cross-sectional view 400 of some other embodiments of the PCM switch having low heater resistance.

As shown in the cross-sectional view 400 of FIG. 4, a first spacer structure 402 may be disposed along the first sidewall 312 of the first portion 304 of the first heating structure 102. The first spacer structure 402 overlies the second portion 306 of the first heating structure 102. The first spacer structure 402 may overlie the third surface 316. In some embodiments, the PCM structure 106 overlies the first spacer structure 402.

In some embodiments, the first spacer structure 402 is disposed along a first sidewall of the first insulator structure 108. In some embodiments, an upper surface of the first spacer structure 402 is substantially coplanar with an upper surface of the first insulator structure 108. In further embodiments, the first spacer structure 402 may have a first sidewall that is substantially vertical and a second sidewall that is angled. In such embodiments, the first sidewall of the first spacer structure 402 may extend vertically from a lower surface of the first spacer structure 402 to the second sidewall of the first spacer structure 402, and the second sidewall of the first spacer structure 402 may extend vertically from the first sidewall of the first spacer structure 402 to the upper surface of the first spacer structure 402.

A second spacer structure 404 may be disposed along the second sidewall 314 of the first portion 304 of the first heating structure 102. The second spacer structure 404 overlies the second portion 306 of the first heating structure 102. The second spacer structure 404 may overlie the fourth surface 318. In some embodiments, the PCM structure 106 overlies the second spacer structure 404.

In some embodiments, the second spacer structure 404 is disposed along a second sidewall of the first insulator structure 108 opposite the first sidewall of the first insulator structure 108. In some embodiments, an upper surface of the second spacer structure 404 is substantially coplanar with the upper surface of the first insulator structure 108. In further embodiments, the second spacer structure 404 may have a first sidewall that is substantially vertical and a second sidewall that is angled. In such embodiments, the first sidewall of the second spacer structure 404 may extend vertically from a lower surface of the second spacer structure 404 to the second sidewall of the second spacer structure 404, and the second sidewall of the second spacer structure 404 may extend vertically from the first sidewall of the second spacer structure 404 to the upper surface of the second spacer structure 404. In some embodiments, the first spacer structure 402 and the second spacer structure 404 may be or comprise, for example, an oxide (e.g., $SiO_2$), a nitride (e.g., SiN), an oxynitride (e.g., SiON), or the like.

Figure 5:
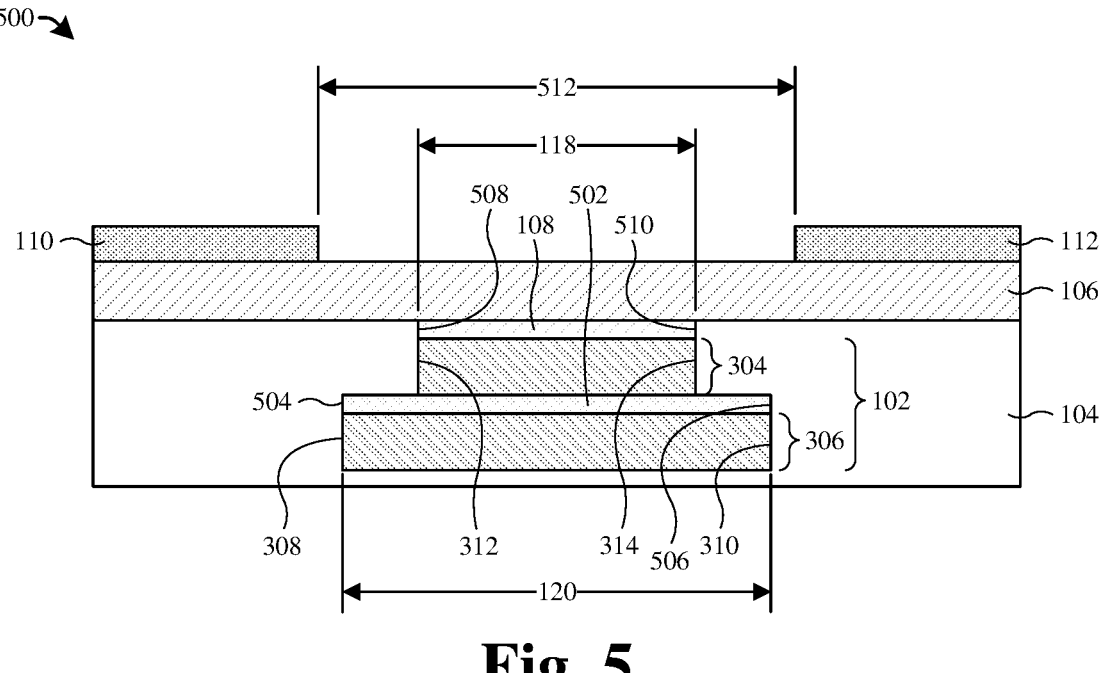
FIG. 5 illustrates a cross-sectional view of some other embodiments of the PCM switch having low heater resistance.

FIG. 5 illustrates a cross-sectional view 500 of some other embodiments of the PCM switch having low heater resistance.

As shown in the cross-sectional view 500 of FIG. 5, an etch stop structure 502 is disposed vertically between the first portion 304 of the first heating structure 102 and the second portion 306 of the first heating structure 102. In some embodiments, the etch stop structure 502 may be or comprise, for example, a metal (e.g., ruthenium (Ru), tungsten (W), iridium (Ir), platinum (Pt), gold (Au), or the like), a metal nitride (e.g., TiN), some other conductive material, or a combination of the foregoing. In further embodiments, the etch stop structure 502 comprises a different material than the first portion 304 and/or the second portion 306 of the first heating structure 102 (e.g., the etch stop structure 502 may be ruthenium (Ru) and the first portion 304 and/or the second portion 306 may be tungsten (W)). In yet further embodiments, the etch stop structure 502 is electrically conductive.

In some embodiments, a width of the etch stop structure 502 is substantially the same as the fourth width 307 (see, e.g., FIG. 3). In further embodiments, a first sidewall 504 of the etch stop structure 502 is aligned with the first sidewall 308 of the second portion 306. In further embodiments, a second sidewall 506 of the etch stop structure 502 is aligned with the second sidewall 310 of the second portion 306. The first sidewall 504 is opposite the second sidewall 506.

The first insulator structure 108 has a first sidewall 508 and a second sidewall 510. The first sidewall 508 is opposite the second sidewall 510. In some embodiments, a width of the first insulator structure 108 is substantially the same as the third width 305 (see, e.g., FIG. 3). In further embodiments, the first sidewall 508 of the first insulator structure 108 is aligned with the first sidewall 312 of the first portion 304. In further embodiments, the second sidewall 510 of the first insulator structure 108 is aligned with the second sidewall 314 of the first portion 304.

Also shown in the cross-sectional view 500 of FIG. 5, the first conductive structure 110 and the second conductive structure 112 are laterally spaced apart by a distance 512. In some embodiments, the distance 512 is greater than or equal to the first width 118. In some embodiments, the distance 512 is greater than the first width 118. In further embodiments, the distance 512 is greater than the second width 120.

Figure 6:
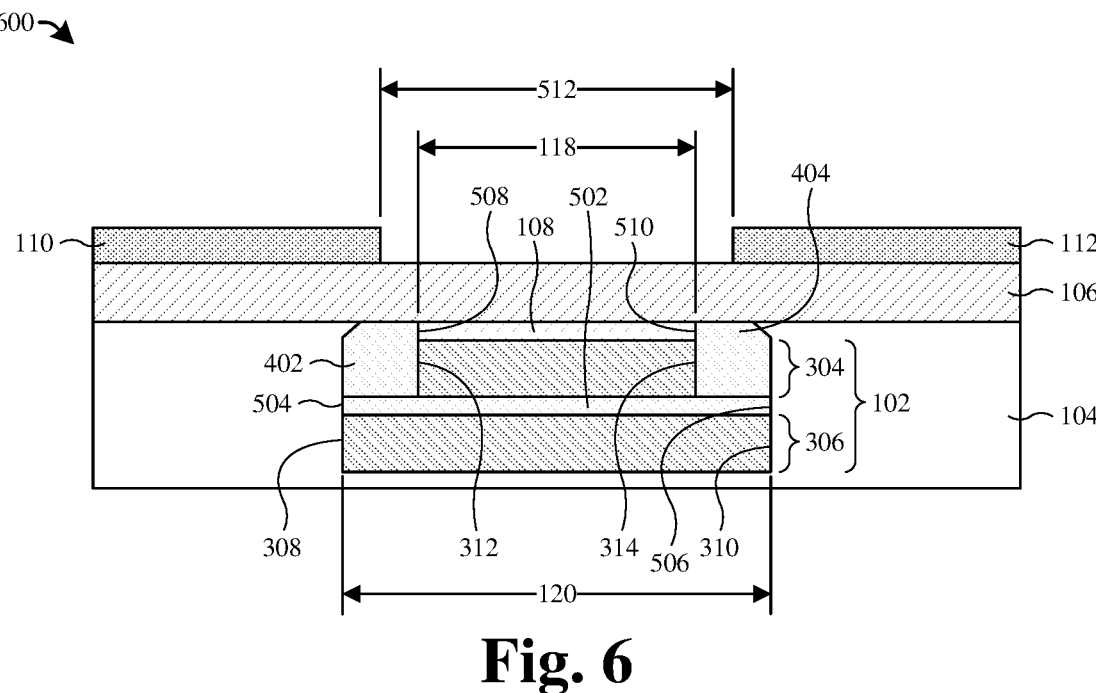
FIG. 6 illustrates a cross-sectional view of some other embodiments of the PCM switch having low heater resistance.

FIG. 6 illustrates a cross-sectional view 600 of some other embodiments of the PCM switch having low heater resistance.

As shown in the cross-sectional view 600 of FIG. 6, the first spacer structure 402 may overlie the etch stop structure 502. In some embodiments, a sidewall (e.g., the first sidewall) of the first spacer structure 402 is substantially aligned with the first sidewall 504 of the etch stop structure 502 and/or the first sidewall 308 of the second portion 306 of the first heating structure 102. In some embodiments, the second spacer structure 404 may overlie the etch stop structure 502. In some embodiments, a sidewall (e.g., the first sidewall) of the second spacer structure 404 is substantially aligned with the second sidewall 506 of the etch stop structure 502 and/or the second sidewall 310 of the second portion 306 of the first heating structure 102.

Also shown in the cross-sectional view 600 of FIG. 6, in some embodiments, the distance 512 may be less than or equal to the second width 120. In further embodiments, the distance 512 may be less than the second width 120. In some embodiments, the distance 512 may be less than or equal to the second width 120 and greater than the first width 118. In some embodiments, if the distance 512 is less than or equal to the second width 120 and greater than the first width 118, the device performance of the PCM switch of the present disclosure may be further improved (e.g., an even further decrease in $R_{ON}$–$C_{OFF}$, an even further reduction in power consumption, even lower operating voltages, etc.).

Figure 7:
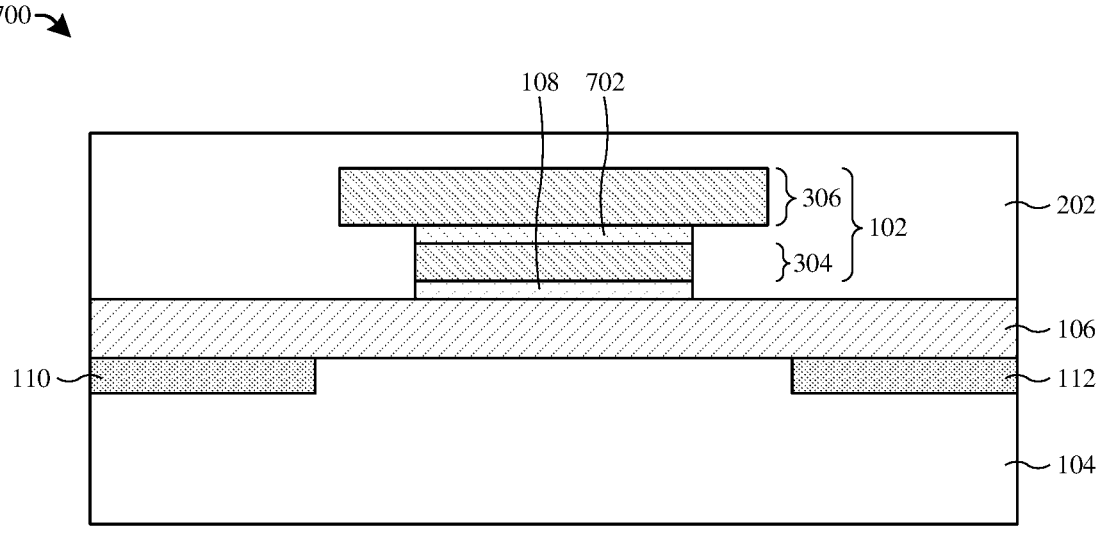
FIG. 7 illustrates a cross-sectional view of some other embodiments of the PCM switch having low heater resistance.

FIG. 7 illustrates a cross-sectional view 700 of some other embodiments of the PCM switch having low heater resistance.

As shown in the cross-sectional view 700 of FIG. 7, in some embodiments, a first capping structure 702 is disposed vertically between the first portion 304 of the first heating structure 102 and the second portion 306 of the first heating structure 102. The first capping structure 702 is disposed in the second dielectric structure 202. In some embodiments, the first capping structure 702 overlies the first portion 304 of the first heating structure 102, and the second portion 306 of the first heating structure 102 overlies the first capping structure 702. In some embodiments, the first capping structure 702 may be or comprise, for example, a metal (e.g., ruthenium (Ru), tungsten (W), iridium (Jr), platinum (Pt), gold (Au), or the like), a metal nitride (e.g., TiN), some other conductive material, or a combination of the foregoing. In further embodiments, the first capping structure 702 comprises a different material than the first portion 304 and/or the second portion 306 of the first heating structure 102 (e.g., the first capping structure 702 may be ruthenium (Ru) and the first portion 304 and/or the second portion 306 may be tungsten (W)). In yet further embodiments, the first capping structure 702 is electrically conductive.

FIG. 8 illustrates a cross-sectional view 800 of some other embodiments of the PCM switch having low heater resistance.

As shown in the cross-sectional view 800 of FIG. 8, the first sidewall 308 of the second portion 306 of the first heating structure 102 extends from the second surface 116 of the first heating structure 102 to the first sidewall 312 of the first portion 304 of the first heating structure 102. The second sidewall 310 of the second portion 306 of the first heating structure 102 extends from the second surface 116 of the first heating structure 102 to the second sidewall 314 of the first portion 304 of the first heating structure 102. The first sidewall 312 of the first portion 304 of the first heating structure 102 extends from the first sidewall 308 of the second portion 306 of the first heating structure 102 to the first surface 114 of the first heating structure 102. The second sidewall 314 of the first portion 304 of the first heating structure 102 extends from the second sidewall 310 of the second portion 306 of the first heating structure 102 to the first surface 114 of the first heating structure 102.

In some embodiments, the first sidewall 308 of the second portion 306 of the first heating structure 102 and the second sidewall 310 of the second portion 306 of the first heating structure 102 are both substantially vertical. In some embodiments, the first sidewall 312 of the first portion 304 of the first heating structure 102 and the second sidewall 314 of the first portion 304 of the first heating structure 102 are both rounded (e.g., arc from a first point to a second point). In further embodiments, the first sidewall 312 and the second sidewall 314 may be concave. In other embodiments, the first sidewall 312 and the second sidewall 314 may be convex. In other embodiments, the first sidewall 312 and the second sidewall 314 may be angled (e.g., extend in a substantially straight line at an angle). In yet other embodiments, the first sidewall 312 and the second sidewall 314 may be angled inward or angled outward.

FIG. 9 illustrates a cross-sectional view 900 of some other embodiments of the PCM switch having low heater resistance.

As shown in the cross-sectional view 900 of FIG. 9, in some embodiments, the first sidewall 312 of the first portion 304 of the first heating structure 102 and the second sidewall 314 of the first portion 304 of the first heating structure 102 are both rounded and are both disposed over the PCM structure 106.

Figure 10:
FIG. 10 illustrates a cross-sectional view of some other embodiments of the PCM switch having low heater resistance.
Figure 10:
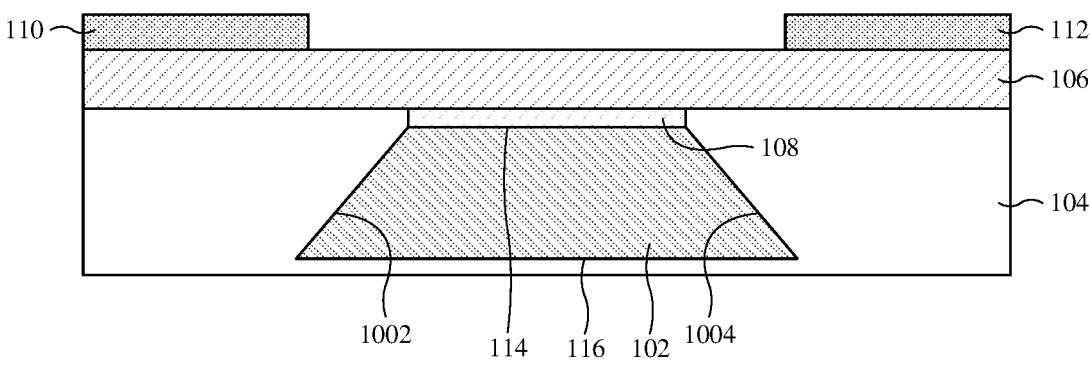

FIG. 10 illustrates a cross-sectional view 1000 of some other embodiments of the PCM switch having low heater resistance.

As shown in the cross-sectional view 1000 of FIG. 10, in some embodiments, the first heating structure 102 has a first sidewall 1002 and a second sidewall 1004. The first sidewall 1002 is opposite the second sidewall 1004. In some embodiments, the first sidewall 1002 extends continuously from the first surface 114 of the first heating structure 102 to the second surface 116 of the first heating structure 102. In some embodiments, the second sidewall 1004 extends continuously from the first surface 114 of the first heating structure 102 to the second surface 116 of the first heating structure 102.

In some embodiments, the first sidewall 1002 and the second sidewall 1004 may be angled, as shown in the cross-sectional view 1000 of FIG. 10. The first sidewall 1002 and the second sidewall 1004 may angle inward or angle outward. Also shown in the cross-sectional view 100 of FIG. 10, in some embodiments, a profile of the first heating structure 102 has a trapezoid shape. In further embodiments, the profile of the first heating structure 102 has an isosceles trapezoid shape. In yet further embodiments, the first heating structure 102 may overlie the PCM structure 106.

Figure 11:
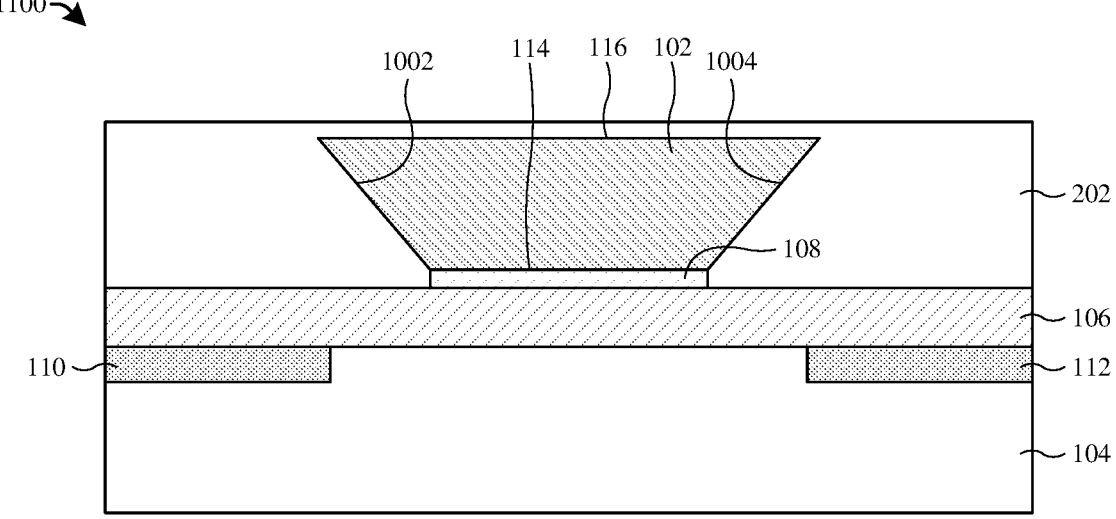
FIG. 11 illustrates a cross-sectional view of some other embodiments of the PCM switch having low heater resistance.

FIG. 11 illustrates a cross-sectional view 1100 of some other embodiments of the PCM switch having low heater resistance.

As shown in the cross-sectional view 1100 of FIG. 11, in some embodiments, the profile of the first heating structure 102 may have an isosceles trapezoid shape, and the first heating structure 102 may be disposed over the PCM structure 106.

Figure 12:
FIG. 12 illustrates a cross-sectional view of some other embodiments of the PCM switch having low heater resistance.
Figure 12:
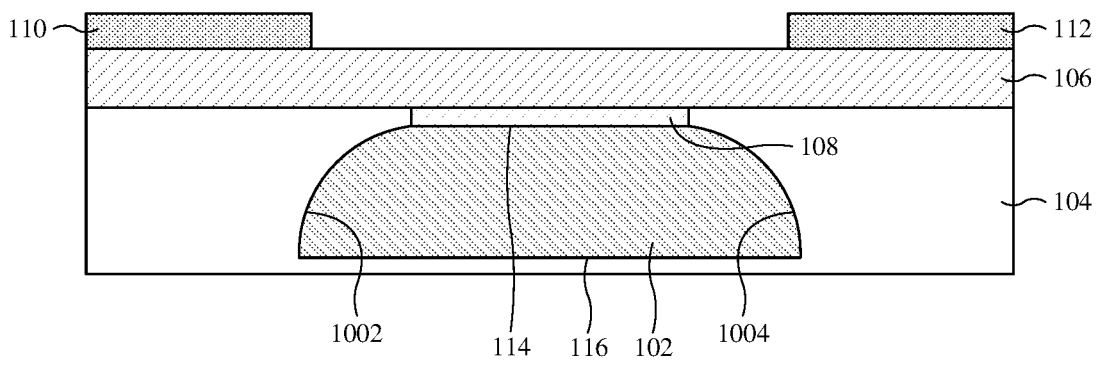

FIG. 12 illustrates a cross-sectional view 1200 of some other embodiments of the PCM switch having low heater resistance.

As shown in the cross-sectional view 1200 of FIG. 12, the first sidewall 1002 of the first heating structure 102 may be rounded. In some embodiments, the second sidewall 1004 of the first heating structure 102 may be rounded. In further embodiments, the first sidewall 1002 and the second sidewall 1004 may both be rounded. In yet further embodiments, the first sidewall 1002 and the second sidewall 1004 may both be convex. In some embodiments, the profile of the first heating structure 102 may have a semi-obround shape (e.g., the shape of half of an obround/stadium).

Figure 13:
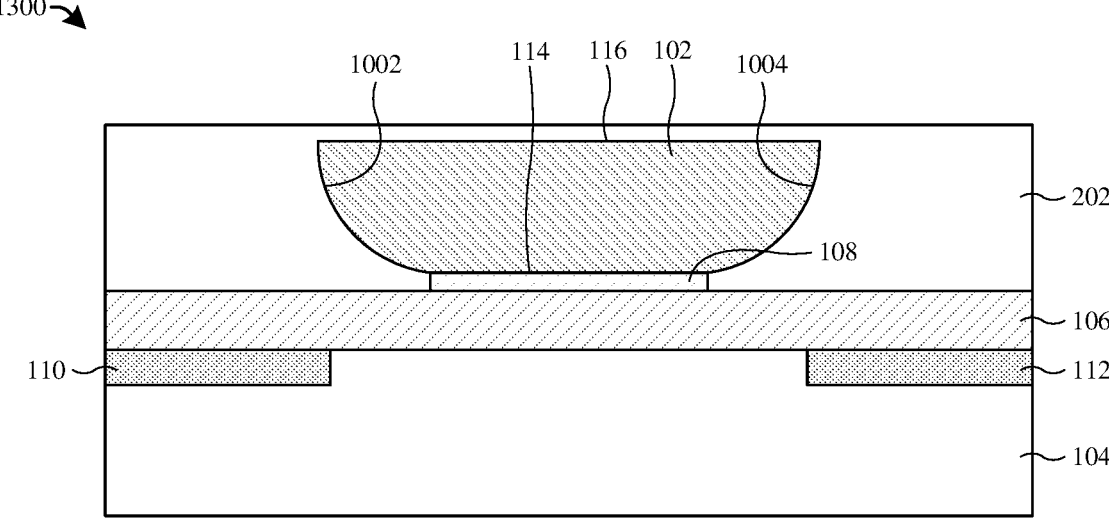
FIG. 13 illustrates a cross-sectional view of some other embodiments of the PCM switch having low heater resistance.

FIG. 13 illustrates a cross-sectional view 1300 of some other embodiments of the PCM switch having low heater resistance.

As shown in the cross-sectional view 1300 of FIG. 13, in some embodiments, the first sidewall 1002 and the second sidewall 1004 may both be rounded, and the first heating structure 102 may be disposed over the PCM structure 106.

Figure 14:
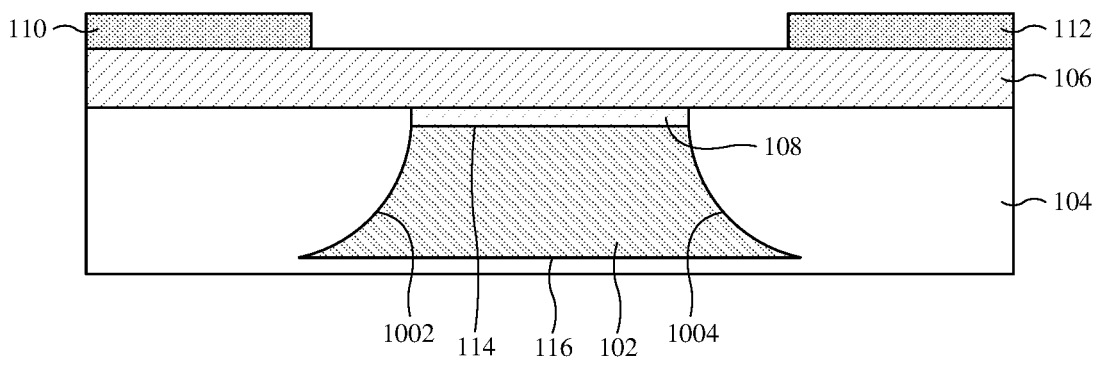
FIG. 14 illustrates a cross-sectional view of some other embodiments of the PCM switch having low heater resistance.

FIG. 14 illustrates a cross-sectional view 1400 of some other embodiments of the PCM switch having low heater resistance.

As shown in the cross-sectional view 1400 of FIG. 14, in some embodiments, the first sidewall 1002 of the first heating structure 102 and the second sidewall 1004 of the first heating structure 102 may both be concave. In further embodiments, the PCM structure 106 may be disposed over the first heating structure 102.

Figure 15:
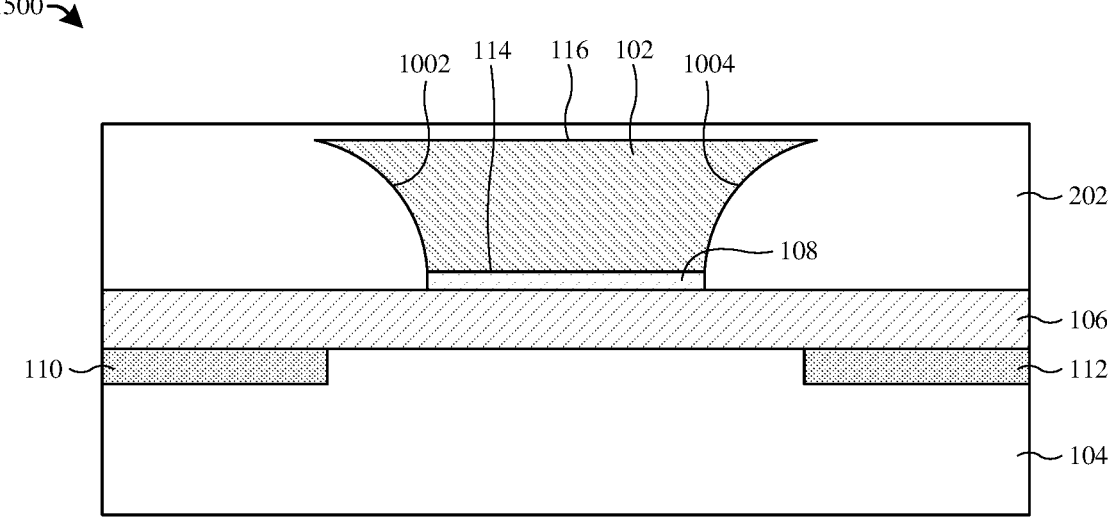
FIG. 15 illustrates a cross-sectional view of some other embodiments of the PCM switch having low heater resistance.

FIG. 15 illustrates a cross-sectional view 1500 of some other embodiments of the PCM switch having low heater resistance.

As shown in the cross-sectional view 1400 of FIG. 14, in some embodiments, the first sidewall 1002 and the second sidewall 1004 may both be concave, and the first heating structure 102 may be disposed over the PCM structure 106.

Figure 16:
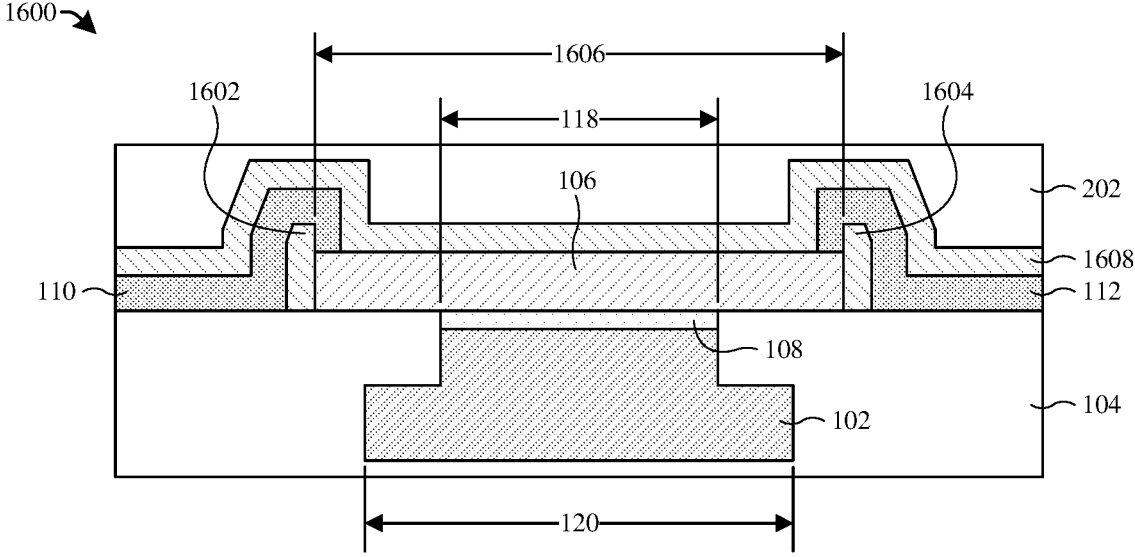
FIG. 16 illustrates a cross-sectional view of some other embodiments of the PCM switch having low heater resistance.

FIG. 16 illustrates a cross-sectional view 1600 of some other embodiments of the PCM switch having low heater resistance.

As shown in the cross-sectional view 1600 of FIG. 16, a third dielectric structure 1602 and a fourth dielectric structure 1604 are disposed over the first dielectric structure 104. In some embodiments, the third dielectric structure 1602 is laterally spaced from the fourth dielectric structure 1604. In other embodiments, the third dielectric structure 1602 and the fourth dielectric structure 1604 may be portions of a larger dielectric structure that laterally surrounds the PCM structure 106. In some embodiments, the PCM structure 106 extends laterally between the third dielectric structure 1602 and the fourth dielectric structure 1604. In some embodiments, the third dielectric structure 1602 may be referred to as a third sidewall structure, and the fourth dielectric structure 1604 may be referred to as a fourth sidewall structure.

The third dielectric structure 1602 and the fourth dielectric structure 1604 are laterally spaced apart by a distance 1606. In some embodiments, the distance 1606 is greater than or equal to the first width 118. In further embodiments, the distance 1606 is greater than the first width 118. In some embodiments, the distance 1606 is greater than the second width 120. In other embodiments, the distance 1606 may be less than or equal to the second width 120. In yet other embodiments, the distance 1606 may be less than the second width 120. In yet other embodiments, the distance 1606 may be less than or equal to the second width 120 and greater than the first width 118.

In some embodiments, the third dielectric structure 1602 may have a first sidewall that is substantially vertical and a second sidewall that is angled. In such embodiments, the first sidewall of the third dielectric structure 1602 may extend vertically from a lower surface of the third dielectric structure 1602 to the second sidewall of the third dielectric structure 1602, and the second sidewall of the third dielectric structure 1602 may extend vertically from the first sidewall of the third dielectric structure 1602 to an upper surface of the third dielectric structure 1602. In some embodiments, the third dielectric structure 1602 may be or comprise, for example, an oxide (e.g., $SiO_2$), a nitride (e.g., SiN), an oxynitride (e.g., SiON), or the like.

In some embodiments, the fourth dielectric structure 1604 may have a first sidewall that is substantially vertical and a second sidewall that is angled. In such embodiments, the first sidewall of the fourth dielectric structure 1604 may extend vertically from a lower surface of the fourth dielectric structure 1604 to the second sidewall of the fourth dielectric structure 1604, and the second sidewall of the fourth dielectric structure 1604 may extend vertically from the first sidewall of the fourth dielectric structure 1604 to an upper surface of the fourth dielectric structure 1604. In some embodiments, the fourth dielectric structure 1604 may be or comprise, for example, an oxide (e.g., $SiO_2$), a nitride (e.g., SiN), an oxynitride (e.g., SiON), or the like.

In some embodiments, the second dielectric structure 202 is disposed over the first conductive structure 110. In some embodiments, the first conductive structure 110 is disposed in the second dielectric structure 202. In some embodiments, the first conductive structure 110 has a first portion that overlies a first portion of the PCM structure 106. The first portion of the first conductive structure 110 is electrically coupled to the first portion of the PCM structure 106. In some embodiments, the first portion of the first conductive structure 110 (directly) contacts the first portion of the PCM structure 106. The first portion of the first conductive structure 110 is disposed laterally between the third dielectric structure 1602 and the fourth dielectric structure 1604. In some embodiments, the first portion of the first conductive structure 110 extends vertically from the first portion of the PCM structure 106 along the third dielectric structure 1602.

In some embodiments, a second portion of the first conductive structure 110 extends from the first portion of the first conductive structure 110 to a third portion of the first conductive structure 110. In some embodiments, the second portion of the first conductive structure 110 overlies the third dielectric structure 1602 and extends vertically along the third dielectric structure 1602 to the third portion of the first conductive structure 110. The third portion of the first conductive structure 110 may overlie the first dielectric structure 104. In further embodiments, the third portion of the first conductive structure 110 extends laterally from the second portion of the first conductive structure 110.

In some embodiments, the second dielectric structure 202 is disposed over the second conductive structure 112. In some embodiments, the second conductive structure 112 is disposed in the second dielectric structure 202. In some embodiments, the second conductive structure 112 has a first portion that overlies a second portion of the PCM structure 106. The first portion of second conductive structure 112 is electrically coupled to the second portion of the PCM structure 106. In some embodiments, the first portion of the second conductive structure 112 (directly) contacts the second portion of the PCM structure 106. The first portion of the second conductive structure 112 is disposed laterally between the third dielectric structure 1602 and the fourth dielectric structure 1604. In some embodiments, the first portion of the second conductive structure 112 extends vertically from the first portion of the PCM structure 106 along the fourth dielectric structure 1604.

In some embodiments, a second portion of the second conductive structure 112 extends from the first portion of the second conductive structure 112 to a third portion of the second conductive structure 112. In some embodiments, the second portion of the second conductive structure 112 overlies the fourth dielectric structure 1604 and extends vertically along the fourth dielectric structure 1604 to the third portion of the second conductive structure 112. The third portion of the second conductive structure 112 may overlie the first dielectric structure 104. In further embodiments, the third portion of the second conductive structure 112 extends laterally from the second portion of the second conductive structure 112.

In some embodiments, a second capping structure 1608 is disposed over the first dielectric structure 104, the first conductive structure 110, the second conductive structure 112, the third dielectric structure 1602, the fourth dielectric structure 1604, and the PCM structure 106. The second capping structure 1608 may be disposed vertically between the second dielectric structure 202 and the PCM structure 106. The second capping structure 1608 may be disposed vertically between the first conductive structure 110 and the second dielectric structure 202. The second capping structure 1608 may be disposed vertically between the second conductive structure 112 and the second dielectric structure 202. In some embodiments, the second capping structure 1608 conformally lines the first dielectric structure 104, the first conductive structure 110, the second conductive structure 112, the third dielectric structure 1602, the fourth dielectric structure 1604, and the PCM structure 106. In further embodiments, the second capping structure 1608 may be or comprise, for example, an oxide (e.g., $SiO_2$), a nitride (e.g., SiN), an oxynitride (e.g., SiON), or the like. In yet further embodiments, the second capping structure 1608 may have a same chemical composition as the third dielectric structure 1602 and the fourth dielectric structure 1604.

Figure 17:
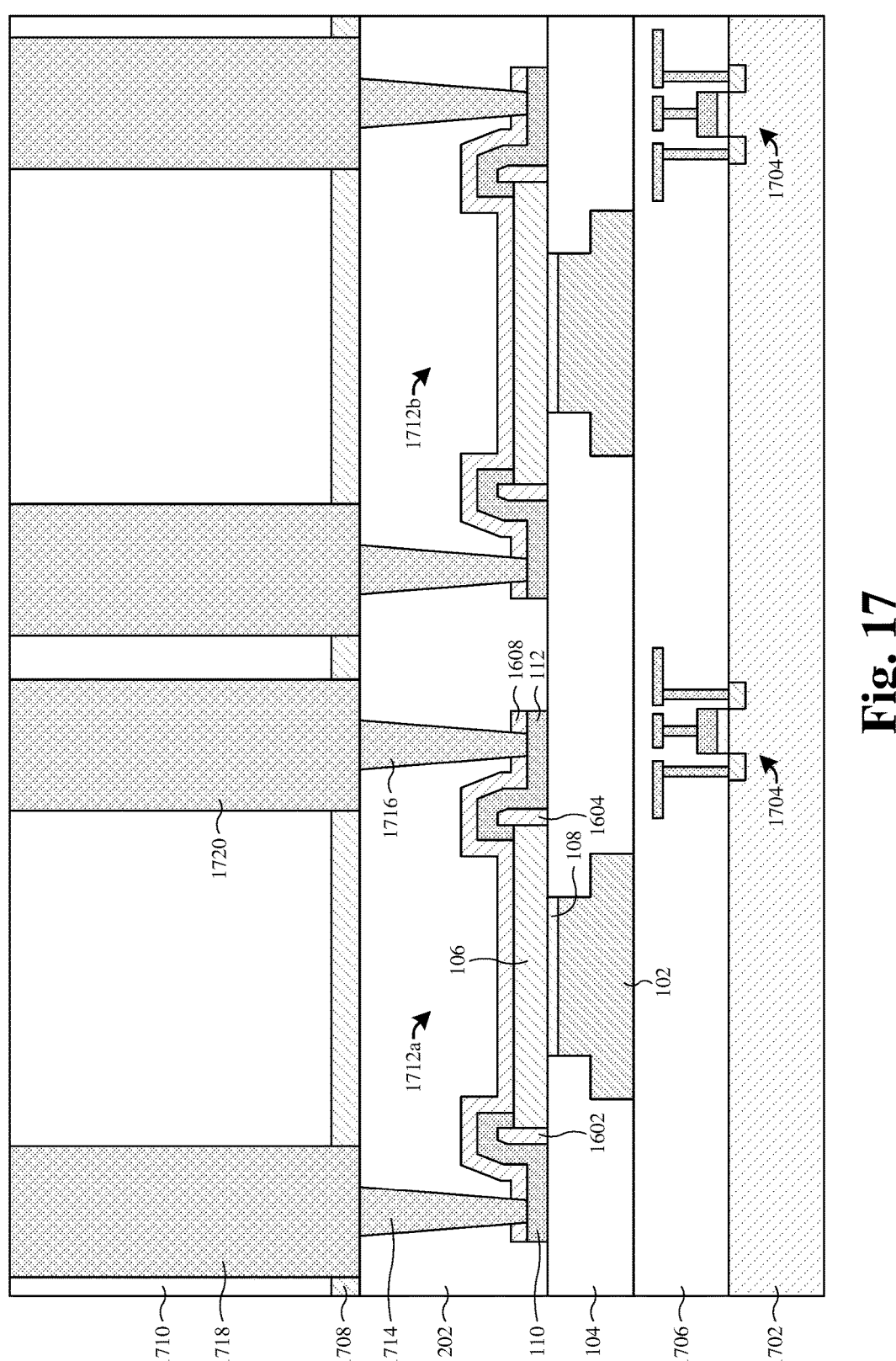
FIG. 17 illustrates a cross-sectional view of some embodiments of an integrated chip (IC) comprising some embodiments of the PCM switch having low heater resistance.

FIG. 17 illustrates a cross-sectional view 1700 of some embodiments of an integrated chip (IC) comprising some embodiments of the PCM switch having low heater resistance.

As shown in the cross-sectional view 1700 of FIG. 17, the IC comprises a substrate 1702 (e.g., a semiconductor substrate). The substrate 1702 may comprise any type of semiconductor body (e.g., monocrystalline silicon/CMOS bulk, germanium (Ge), a group III-V semiconductor material, silicon-germanium (SiGe), silicon on insulator (SOI), etc.). One or more semiconductor devices 1704 (e.g., metal-oxide-semiconductor field-effect transistors (MOSFETs)) may be disposed on/over the substrate 1702.

A fifth dielectric structure 1706 is disposed over the substrate 1702 and the one or more semiconductor devices 1704. The fifth dielectric structure 1706 comprises one or more stacked dielectric layers, which may respectively comprise an oxide (e.g., silicon dioxide ($SiO_2$)), a low-k dielectric, or the like. In further embodiments, the fifth dielectric structure 1706 may be a third ILD structure, and the one or more stacked dielectric layers may be one or more stacked ILD layers. In some embodiments, (a portion of) a conductive interconnect structure (e.g., copper interconnect) is embedded in the fifth dielectric structure 1706 and electrically coupled to the one or more semiconductor devices 1704 in a predefined manner.

In some embodiments, a first etch stop layer 1708 is disposed over the second dielectric structure 202. The first etch stop layer 1708 may be or comprise, for example, an oxide (e.g., $SiO_2$), a nitride (e.g., SiN), an oxynitride (e.g., SiON), or the like. In some embodiments, a sixth dielectric structure 1710 is disposed over the first etch stop layer 1708. The sixth dielectric structure 1710 comprises one or more stacked dielectric layers, which may respectively comprise an oxide (e.g., silicon dioxide ($SiO_2$)), a low-k dielectric, or the like. In further embodiments, the sixth dielectric structure 1710 may be a fourth ILD structure, and the one or more stacked dielectric layers may be one or more stacked ILD layers.

In some embodiments, the IC comprises a plurality of PCM switches 1712*a-b*. For example, the IC may comprise a first PCM switch 1712*a* and a second PCM switch 1712*b*. In some embodiments, the plurality of PCM switches 1712*a-b* may be electrically coupled to the one or more semiconductor devices 1704 (e.g., via the portion of the conductive interconnect structure).

A first conductive via 1714 is disposed in the second dielectric structure 202. The first conductive via 1714 overlies the first conductive structure 110. The first conductive via 1714 is electrically coupled to the first conductive structure 110. The first conductive via 1714 may (directly) contact the first conductive structure 110. The first conductive via 1714 may be or comprise, for example, copper (Cu), gold (Au), silver (Ag), tungsten (W), or the like. It will be appreciated that the first conductive via 1714 may be a conductive feature of a conductive interconnect structure (e.g., copper interconnect structure) that is embedded in the fifth dielectric structure 1706, the first dielectric structure 104, the second dielectric structure 202, and the sixth dielectric structure 1710.

A second conductive via 1716 is disposed in the second dielectric structure 202. The second conductive via 1716 overlies the second conductive structure 112. The second conductive via 1716 is electrically coupled to the second conductive structure 112. The second conductive via 1716 may (directly) contact the second conductive structure 112. The second conductive via 1716 may be or comprise, for example, copper (Cu), gold (Au), silver (Ag), tungsten (W), or the like. It will be appreciated that the second conductive via 1716 may be a conductive feature of the conductive interconnect structure.

A third conductive structure 1718 (e.g., conductive via, conductive line/wire, conductive input/output (I/O) structure) is disposed in the sixth dielectric structure 1710. In some embodiments, the third conductive structure 1718 is also disposed in the first etch stop layer 1708. The third conductive structure 1718 overlies the first conductive via 1714. The third conductive structure 1718 is electrically coupled to the first conductive via 1714. The first conductive via 1714 electrically couples the third conductive structure 1718 to the first conductive structure 110. The third conductive structure 1718 may (directly) contact the first conductive via 1714. The third conductive structure 1718 may be or comprise, for example, copper (Cu), gold (Au), silver (Ag), tungsten (W), or the like. It will be appreciated that the third conductive structure 1718 may be a conductive feature of the conductive interconnect structure.

A fourth conductive structure 1720 (e.g., conductive via, conductive line/wire, conductive I/O structure) is disposed in the sixth dielectric structure 1710. In some embodiments, the fourth conductive structure 1720 is also disposed in the first etch stop layer 1708. The fourth conductive structure 1720 overlies the second conductive via 1716. The fourth conductive structure 1720 is electrically coupled to the second conductive via 1716. The second conductive via 1716 electrically couples the fourth conductive structure 1720 to the second conductive structure 112. The fourth conductive structure 1720 may (directly) contact the second conductive via 1716. The fourth conductive structure 1720 may be or comprise, for example, copper (Cu), gold (Au), silver (Ag), tungsten (W), or the like. It will be appreciated that the fourth conductive structure 1720 may be a conductive feature of the conductive interconnect structure.

FIGS. 18-23 illustrate a series of cross-sectional views 1800-2300 of some embodiments of a method for forming a PCM switch having low heater resistance.

Figure 18:
FIGS. 18-23 illustrate a series of cross-sectional views of some embodiments of a method for forming a PCM switch having low heater resistance.
Figure 18:
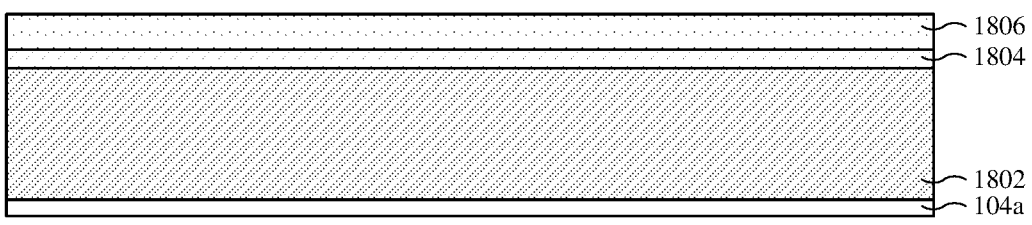

As shown in the cross-sectional view 1800 of FIG. 18, a first heating layer 1802 is formed over a first dielectric layer 104a. In some embodiments, the first dielectric layer 104a is an individual dielectric layer of a first dielectric structure 104. In some embodiments, the first dielectric layer 104a may be or comprise, for example, an oxide (e.g., $SiO_2$, a low-k dielectric, or the like). In some embodiments, the first heating layer 1802 may be or comprise, for example, a metal (e.g., tungsten (W), iridium (Jr), ruthenium (Ru), platinum (Pt), gold (Au), or the like), a metal nitride (e.g., TiN), some other conductive material, or a combination of the foregoing (e.g., a combination of tungsten (W) and TiN). In some embodiments, a process for forming the first heating layer 1802 comprises depositing the first heating layer 1802 on the first dielectric layer 104a. The first heating layer 1802 may be deposited by, for example, chemical vapor deposition (CVD), physical vapor deposition (PVD), atomic layer deposition (ALD), sputtering, electroless plating, electroplating, some other deposition process, or a combination of the foregoing.

Also shown in the cross-sectional view 1800 of FIG. 18, an insulator layer 1804 is formed over the first heating layer 1802. In some embodiments, the insulator layer 1804 may be or comprise, for example, an oxide (e.g., $SiO_2$), a nitride (e.g., SiN), a carbide (e.g., SiC), a carbonitride (e.g., SiCN), a metal nitride (e.g., AN), carbon (C), some other insulating material, or a combination of the foregoing. In some embodiments, a process for forming the insulator layer 1804 comprises depositing or growing the insulator layer 1804 on the first heating layer 1802. In some embodiments, the insulator layer 1804 may be formed by, for example, CVD, PVD, ALD, thermal oxidation, some other deposition or growth process, or a combination of the foregoing.

Also shown in the cross-sectional view 1800 of FIG. 18, a first hardmask layer 1806 is formed over the insulator layer 1804. In some embodiments, the first hardmask layer 1806 may be or comprise, for example, an oxide (e.g., $SiO_2$), a nitride (e.g., SiN), an oxynitride (e.g., SiON), some other hardmask material, or a combination of the foregoing. In some embodiments, a process for forming the first hardmask layer 1806 comprises depositing the first hardmask layer 1806 on the insulator layer 1804. In some embodiments, the first hardmask layer 1806 may be formed by, for example, CVD, PVD, ALD, some other deposition process, or a combination of the foregoing.

Figure 19:
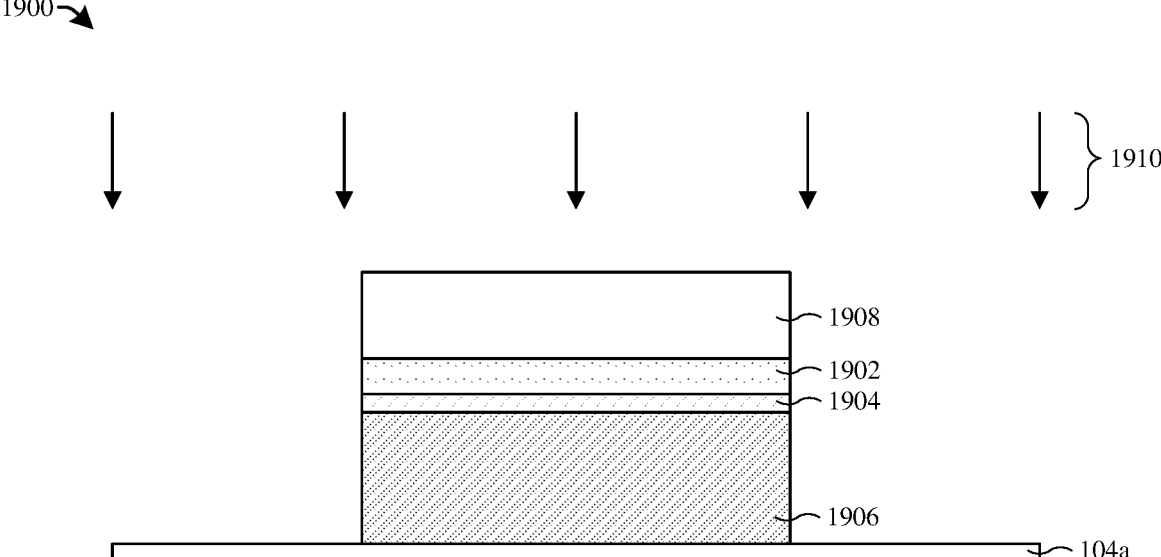

As shown in the cross-sectional view 1900 of FIG. 19, a portion of the first hardmask layer 1806 is removed, thereby forming a first hardmask structure 1902; a portion of the insulator layer 1804 is removed, thereby forming a second insulator structure 1904; and a portion of the first heating layer 1802, thereby forming a second heating structure 1906. In some embodiments, a process for forming the first hardmask structure 1902, the second insulator structure 1904, and the second heating structure 1906 comprises forming a first patterned masking layer 1908 (e.g., positive/negative photoresist, a hardmask, etc.) over the first hardmask layer 1806 (see, e.g., FIG. 18). In some embodiments, a process for forming the first patterned masking layer 1908 comprises forming a masking layer (not shown) on the first hardmask layer 1806 (e.g., via a spin-on process, CVD, PVD, ALD, some other deposition or growth process, or a combination of the foregoing), exposing the masking layer to a pattern (e.g., via a lithography process, such as photolithography, extreme ultraviolet lithography, or the like), and developing the masking layer, thereby forming the first patterned masking layer 1908.

Thereafter, with the first patterned masking layer 1908 in place, a first etching process 1910 is performed on the first hardmask layer 1806, the insulator layer 1804, and the first heating layer 1802. The first etching process 1910 removes unmasked portions of the first hardmask layer 1806, the insulator layer 1804, and the first heating layer 1802, thereby respectively forming the first hardmask structure 1902, the second insulator structure 1904, and the second heating structure 1906 according to the first patterned masking layer 1908. In some embodiments, the first etching process 1910 may be, for example, a wet etching process, a dry etching process, a reactive ion etching (RIE) process, some other etching process, or a combination of the foregoing. In further embodiments, the first patterned masking layer 1908 may be subsequently stripped away.

Figure 20:
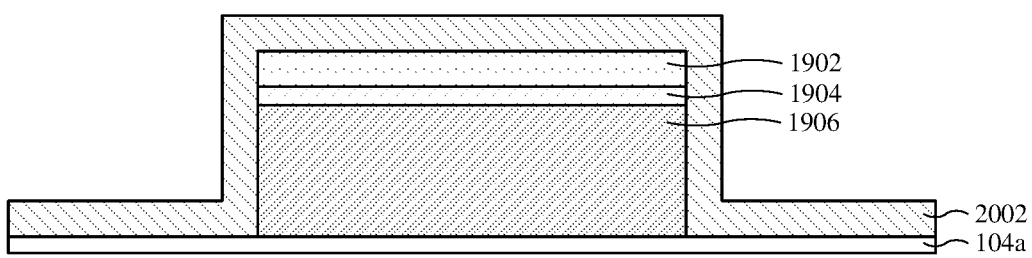

As shown in the cross-sectional view 2000 of FIG. 20, a second hardmask layer 2002 is formed over the first hardmask structure 1902, the second insulator structure 1904, the second heating structure 1906, and the first dielectric layer 104a. In some embodiments, the second hardmask layer 2002 is formed as a conformal layer. In some embodiments, the second hardmask layer 2002 may be or comprise, for example, an oxide (e.g., $SiO_2$), a nitride (e.g., SiN), an oxynitride (e.g., SiON), some other hardmask material, or a combination of the foregoing. In some embodiments, a process for forming the second hardmask layer 2002 comprises depositing the second hardmask layer 2002 on the first hardmask structure 1902, the second insulator structure 1904, the second heating structure 1906, and the first dielectric layer 104a. In some embodiments, the second hardmask layer 2002 may be formed by, for example, CVD, PVD, ALD, some other deposition process, or a combination of the foregoing.

Figure 21:
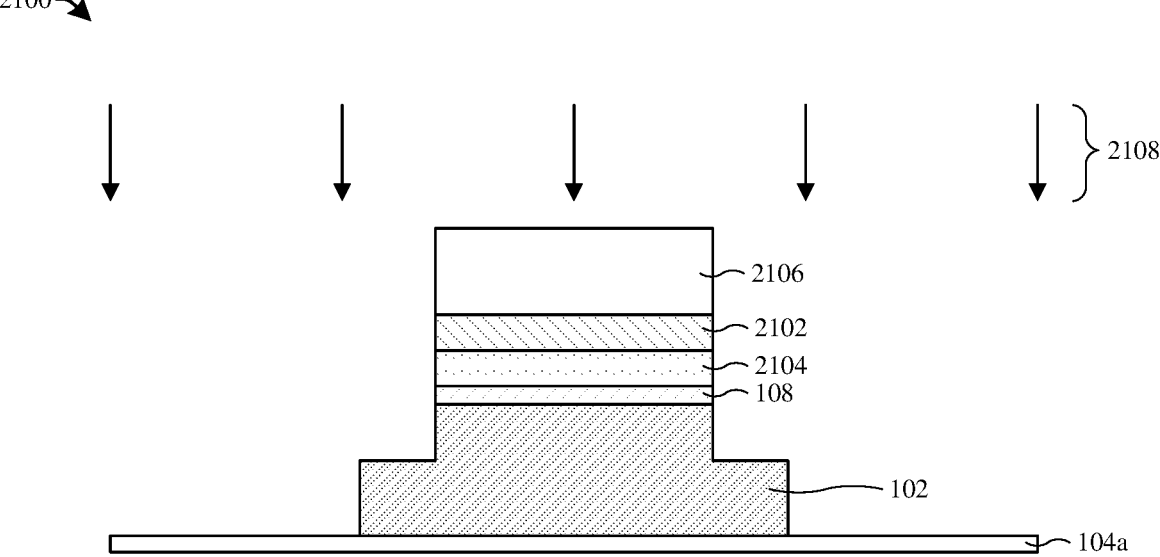

As shown in the cross-sectional view 2100 of FIG. 21, a portion of the second hardmask layer 2002 is removed, thereby forming a second hardmask structure 2102; a portion of the first hardmask structure 1902 is removed, thereby forming a third hardmask structure 2104; a portion of the second insulator structure 1904 is removed, thereby forming a first insulator structure 108; and a portion of the second heating structure 1906 is removed, thereby forming a first heating structure 102.

In some embodiments, a process for forming the second hardmask structure 2102, the third hardmask structure 2104, the first insulator structure 108, and the first heating structure 102 comprises forming a second patterned masking layer 2106 (e.g., positive/negative photoresist, a hardmask, etc.) over the second hardmask layer 2002 (see, e.g., FIG. 20). In some embodiments, a process for forming the second patterned masking layer 2106 comprises forming a masking layer (not shown) on the second hardmask layer 2002 (e.g., via a spin-on process, CVD, PVD, ALD, some other deposition or growth process, or a combination of the foregoing), exposing the masking layer to a pattern (e.g., via a lithography process, such as photolithography, extreme ultraviolet lithography, or the like), and developing the masking layer, thereby forming the second patterned masking layer 2106.

Thereafter, with the second patterned masking layer 2106 in place, a second etching process 2108 is performed on the second hardmask layer 2002, the first hardmask structure 1902, the second insulator structure 1904, and the second heating structure 1906. The second etching process 2108 removes unmasked portions of the second hardmask layer 2002, the first hardmask structure 1902, the second insulator structure 1904, and the second heating structure 1906, thereby respectively forming the second hardmask structure 2102, the third hardmask structure 2104, the first insulator structure 108, and the first heating structure 102 according to the second patterned masking layer 2106.

In some embodiments, the second etching process 2108 may partially etch through the second heating structure 1906 (e.g., not completely through the portion of the second heating structure 1906), as shown in the cross-sectional view 2100 of FIG. 21. In further embodiments, the second etching process 2108 may be, for example, a wet etching process, a dry etching process, a RIE process, some other etching process, or a combination of the foregoing. In further embodiments, the second patterned masking layer 2106 may be subsequently stripped away.

Figure 22:
Figure 22:
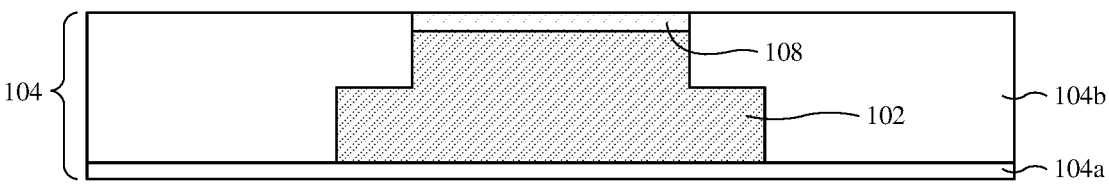

As shown in the cross-sectional view 2200 of FIG. 22, a second dielectric layer 104b is formed over the first dielectric layer 104a and around (e.g., laterally around) both the first insulator structure 108 and the first heating structure 102. In some embodiments, the second dielectric layer 104b is an individual dielectric layer of the first dielectric structure 104. In some embodiments, the second dielectric layer 104b may be or comprise, for example, an oxide (e.g., $SiO_2$, a low-k dielectric, or the like).

In some embodiments, a process for forming the second dielectric layer 104b comprises depositing the second dielectric layer 104b over the first dielectric layer 104a, the first heating structure 102, the first insulator structure 108, the third hardmask structure 2104, and the second hardmask structure 2102 (see, e.g., FIG. 21). The second dielectric layer 104b may be deposited by, for example, CVD, PVD, ALD, some other deposition process, or a combination of the foregoing. Thereafter, a planarization process (e.g., chemical-mechanical polishing (CMP), an etch back process, etc.) is performed on the second dielectric layer 104b, the third hardmask structure 2104, and the second hardmask structure 2102. In some embodiments, the planarization process removes the third hardmask structure 2104, the second hardmask structure 2102, and an upper portion of the second dielectric layer 104b, thereby planarizing an upper surface of the second dielectric layer 104b and an upper surface of the first insulator structure 108.

Figure 23:
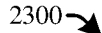
Figure 23:
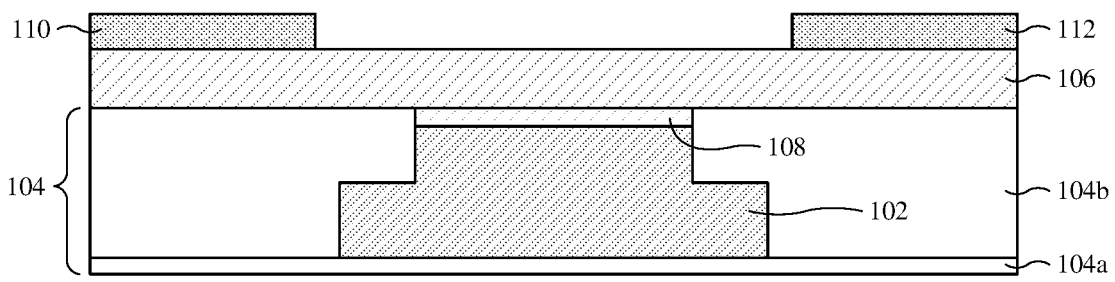

As shown in the cross-sectional view 2300 of FIG. 23, a PCM structure 106 is formed over the second dielectric layer 104b, the first insulator structure 108, and the first heating structure 102. In some embodiments, a process for forming the PCM structure 106 comprises depositing and/or growing a PCM layer (not shown) on the second dielectric layer 104b and the first insulator structure 108. In some embodiments, the PCM layer may be or comprise, for example, germanium telluride (GeTe), germanium antimony telluride (GeSbTe), vanadium oxide ($VO_2$), some other material capable of changing resistive states by changing phases, or a combination of the foregoing. In some embodiments, the PCM layer may be formed by, for example, CVD, PVD, ALD, sputtering, an epitaxial process, some other deposition or growth process, or a combination of the foregoing.

A third patterned masking layer (not shown) (e.g., positive/negative photoresist, a hardmask, etc.) may then be formed over the PCM layer. Thereafter, an etching process (e.g., wet etching process, dry etching process, RIE process, etc.) may be performed on the PCM layer. The etching process removes unmasked portions of the PCM layer, thereby forming the PCM structure 106 according to the third patterned masking layer. In further embodiments, the third patterned masking layer may be subsequently stripped away.

Also shown in the cross-sectional view 2300 of FIG. 23, a first conductive structure 110 and a second conductive structure 112 are formed over and electrically coupled to the PCM structure 106. The first conductive structure 110 is formed laterally spaced from the second conductive structure 112. The first conductive structure 110 may be formed on a first side of the first heating structure 102. The second conductive structure 112 may be formed on a second side of the first heating structure 102 opposite the first side of the first heating structure 102.

In some embodiments, a process for forming the first conductive structure 110 and the second conductive structure 112 comprises depositing a conductive layer (not shown) on the PCM structure 106 (and the second dielectric layer 104b). In some embodiments, the conductive layer may be or comprise, for example, a metal (e.g., tungsten (W), copper (Cu), gold (Au), silver (Ag), or the like), a metal nitride (e.g., TiN, TaN, or the like), some other conductive material, or a combination of the foregoing. In some embodiments, the conductive layer may be formed by, for example, CVD, PVD, ALD, sputtering, electrochemical plating, electroless plating, some other deposition process, or a combination of the foregoing.

A fourth patterned masking layer (not shown) (e.g., positive/negative photoresist, a hardmask, etc.) may then be formed over the conductive layer. Thereafter, an etching process (e.g., wet etching process, dry etching process, RIE process, etc.) may be performed on the conductive layer. The etching process removes unmasked portions of the conductive layer, thereby forming the first conductive structure 110 and the second conductive structure 112. In further embodiments, the fourth patterned masking layer may be subsequently stripped away.

In some embodiments, the method for forming the PCM switch having low heater resistance illustrated in FIGS. 18-23 correspond to a first two mask technique (e.g., due to the method utilizing two masks to form the first heating structure 102).

FIGS. 24-29 illustrate a series of cross-sectional views 2400-2900 of some other embodiments of a method for forming a PCM switch having low heater resistance.

US 12,598,756 B2

23

Figure 24:
FIGS. 24-29 illustrate a series of cross-sectional views of some other embodiments of a method for forming a PCM switch having low heater resistance.
Figure 24:
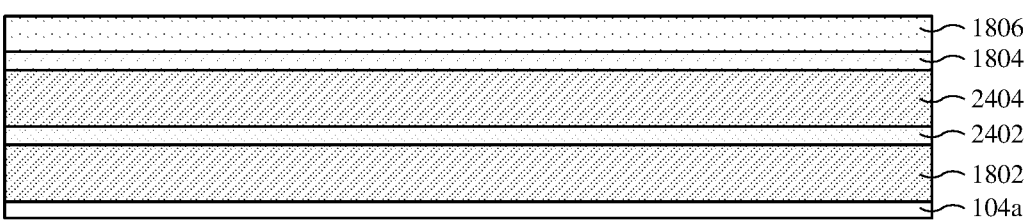

As shown in the cross-sectional view 2400 of FIG. 24, the first heating layer 1802 is formed over the first dielectric layer 104*a*.

Also shown in the cross-sectional view 2400 of FIG. 24, a second etch stop layer 2402 is formed over the first heating layer 1802. In some embodiments, the second etch stop layer 2402 may be or comprise, for example, a metal (e.g., ruthenium (Ru), tungsten (W), iridium (Jr), platinum (Pt), gold (Au), or the like), a metal nitride (e.g., TiN), some other conductive material, or a combination of the foregoing. In further embodiments, the second etch stop layer 2402 comprises a different material than the first heating layer 1802 (e.g., the second etch stop layer 2402 may be ruthenium (Ru) and the first heating layer 1802 may be tungsten (W)). In yet further embodiments, the second etch stop layer 2402 is electrically conductive. In some embodiments, a process for forming the second etch stop layer 2402 comprises depositing or growing the second etch stop layer 2402 on the first heating layer 1802. The second etch stop layer 2402 may be formed by, for example, CVD, PVD, ALD, thermal oxidation, sputtering, some other deposition or growth process, or a combination of the foregoing.

Also shown in the cross-sectional view 2400 of FIG. 24, a second heating layer 2404 is formed over the second etch stop layer 2402. In some embodiments, the second heating layer 2404 may be or comprise, for example, a metal (e.g., tungsten (W), iridium (Jr), ruthenium (Ru), platinum (Pt), gold (Au), or the like), a metal nitride (e.g., TiN), some other conductive material, or a combination of the foregoing (e.g., a combination of tungsten (W) and TiN). In further embodiments, the second etch stop layer 2402 comprises a different material than the second heating layer 2404 (e.g., the second etch stop layer 2402 may be ruthenium (Ru) and the second heating layer 2404 may be tungsten (W)). In some embodiments, a process for forming the second heating layer 2404 comprises depositing the second heating layer 2404 on the second etch stop layer 2402. The second heating layer 2404 may be deposited by, for example, CVD, PVD, ALD, sputtering, electroless plating, electroplating, some other deposition process, or a combination of the foregoing.

Also shown in the cross-sectional view 2400 of FIG. 24, the insulator layer 1804 is formed over the second heating layer 2404, and the first hardmask layer 1806 may be formed over the insulator layer 1804.

Figure 25:
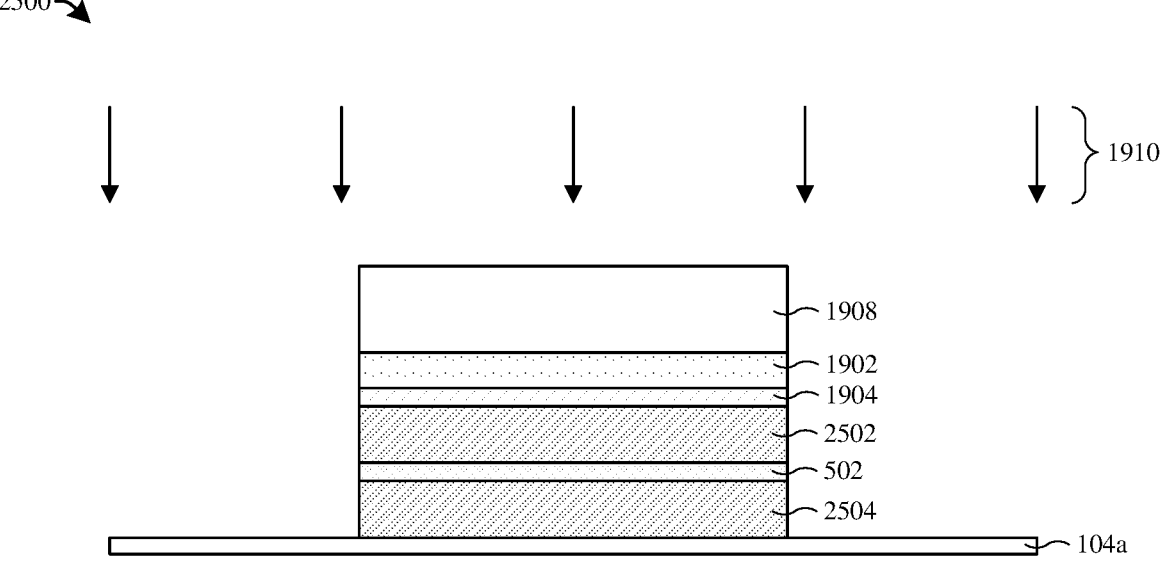

As shown in the cross-sectional view 2500 of FIG. 25, the portion of the first hardmask layer 1806 is removed, thereby forming the first hardmask structure 1902; the portion of the insulator layer 1804 is removed, thereby forming the second insulator structure 1904; a portion of the second heating layer 2404 is removed, thereby forming a third heating structure 2502; a portion of the second etch stop layer 2402 is removed, thereby forming an etch stop structure 502; and a portion of the first heating layer 1802 is removed, thereby forming a fourth heating structure 2504.

In some embodiments, a process for forming the first hardmask structure 1902, the second insulator structure 1904, the third heating structure 2502, the etch stop structure 502, and the fourth heating structure 2504 comprises forming the first patterned masking layer 1908 over the first hardmask layer 1806 (see, e.g., FIG. 24). Thereafter, with the first patterned masking layer 1908 in place, the first etching process 1910 is performed on the first hardmask layer 1806, the insulator layer 1804, the second heating layer 2404, the second etch stop layer 2402, and the first heating layer 1802. The first etching process 1910 removes unmasked portions of the first hardmask layer 1806, the insulator layer 1804, the second heating layer 2404, the second etch stop layer 2402, and the first heating layer 1802, thereby respectively forming the first hardmask structure 1902, the second insulator structure 1904, the third heating structure 2502, the etch stop structure 502, and the fourth heating structure 2504 according to the first patterned masking layer 1908. In some embodiments, the first patterned masking layer 1908 may be subsequently stripped away.

Figure 26:
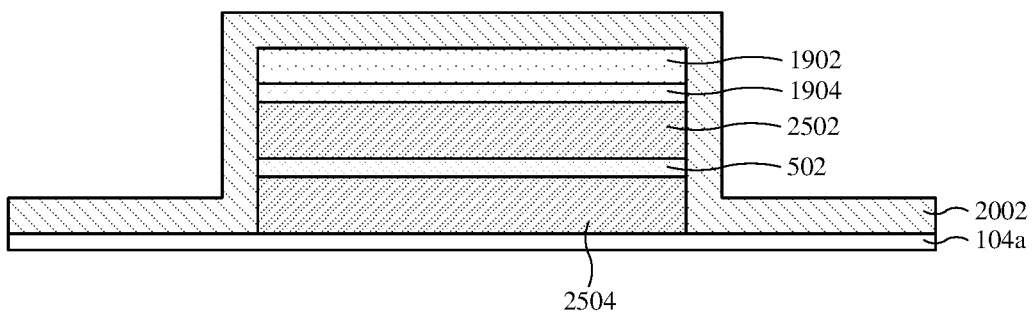

As shown in the cross-sectional view 2600 of FIG. 26, the second hardmask layer 2002 is formed over the first hardmask structure 1902, the second insulator structure 1904, the third heating structure 2502, the etch stop structure 502, the fourth heating structure 2504, and the first dielectric layer 104*a*.

Figure 27:
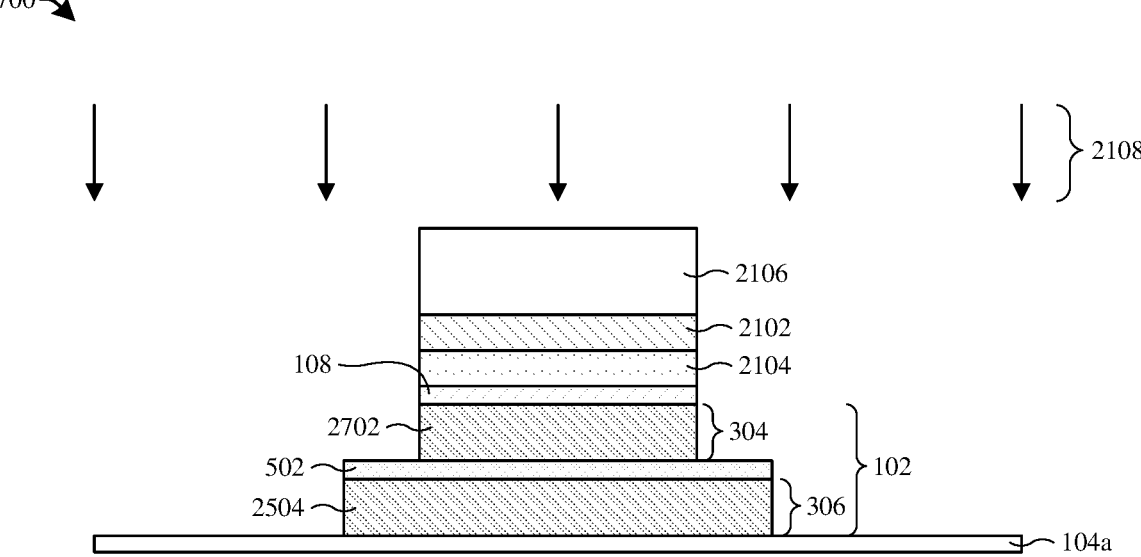

As shown in the cross-sectional view 2700 of FIG. 27, the portion of the second hardmask layer 2002 is removed, thereby forming the second hardmask structure 2102; the portion of the first hardmask structure 1902 is removed, thereby forming the third hardmask structure 2104; the portion of the second insulator structure 1904 is removed, thereby forming the first insulator structure 108; and a portion of the third heating structure 2502 is removed, thereby forming a fifth heating structure 2702. In some embodiments, the fifth heating structure 2702 corresponds to a first portion 304 of a first heating structure 102. In further embodiments, the fourth heating structure 2504 corresponds to a second portion 306 of the first heating structure 102. In yet further embodiments, forming the fifth heating structure 2702 may complete formation of the first heating structure 102.

In some embodiments, a process for forming the second hardmask structure 2102, the third hardmask structure 2104, the first insulator structure 108, and the fifth heating structure 2702 comprises forming the second patterned masking layer 2106 over the second hardmask layer 2002 (see, e.g., FIG. 26). Thereafter, with the second patterned masking layer 2106 in place, the second etching process 2108 is performed on the second hardmask layer 2002, the first hardmask structure 1902, the second insulator structure 1904, and the third heating structure 2502. The second etching process 2108 removes unmasked portions of the second hardmask layer 2002, the first hardmask structure 1902, the second insulator structure 1904, and the third heating structure 2502, thereby respectively forming the second hardmask structure 2102, the third hardmask structure 2104, the first insulator structure 108, and the fifth heating structure 2702 according to the second patterned masking layer 2106. In some embodiments, the second etching process 2108 may stop on the etch stop structure 502, as shown in the cross-sectional view 2700 of FIG. 27. In such embodiments, the second etching process 2108 may expose the etch stop structure 502. In some embodiments, the second patterned masking layer 2106 may be subsequently stripped away.

Figure 28:
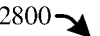
Figure 28:
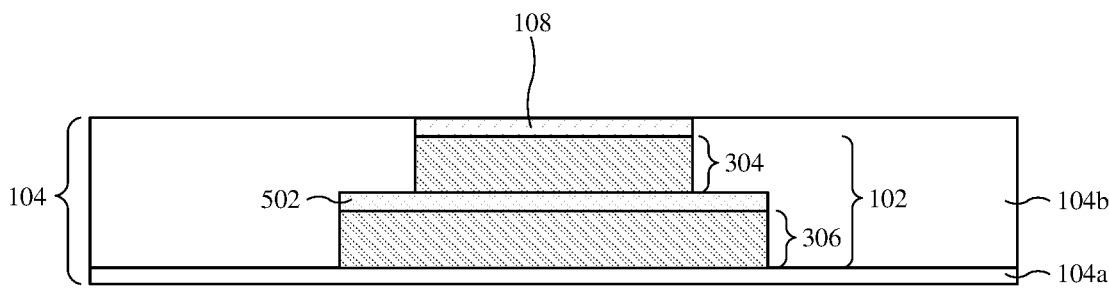

As shown in the cross-sectional view 2800 of FIG. 28, the second dielectric layer 104*b* is formed over the first dielectric layer 104*a*. The second dielectric layer 104*b* is also formed around (e.g., laterally around) the first insulator structure 108, the first portion 304 of the first heating structure 102, the etch stop structure 502, and the second portion 306 of the first heating structure 102.

Figure 29:
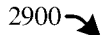
Figure 29:
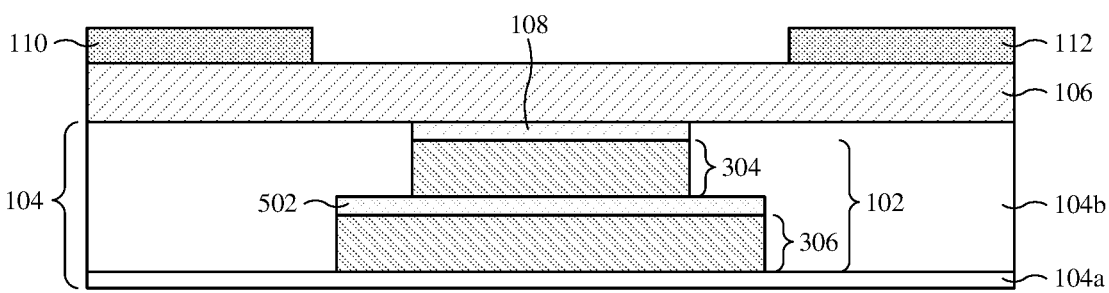

As shown in the cross-sectional view 2900 of FIG. 29, the PCM structure 106 is formed over the second dielectric layer 104*b*, the first insulator structure 108, and the first heating structure 102. The first conductive structure 110 and the second conductive structure 112 may also be formed over and electrically coupled to the PCM structure 106.

In some embodiments, the method for forming the PCM switch having low heater resistance illustrated in FIGS. 24-29 may correspond to another second two mask technique (e.g., due to the method utilizing two masks to form the first heating structure 102).

FIGS. 30-36 illustrate a series of cross-sectional views 3000-3600 of some other embodiments of a method for forming a PCM switch having low heater resistance.

Figure 30:
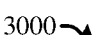
FIGS. 30-36 illustrate a series of cross-sectional views of some other embodiments of a method for forming a PCM switch having low heater resistance.
Figure 30:
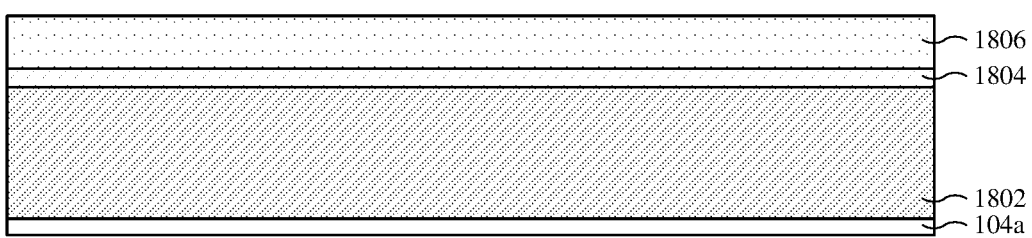

As shown in the cross-sectional view 3000 of FIG. 30, the first heating layer 1802 is formed over the first dielectric layer 104a, the insulator layer 1804 is formed over the first heating layer 1802, and the first hardmask layer 1806 is formed over the insulator layer 1804.

Figure 31:
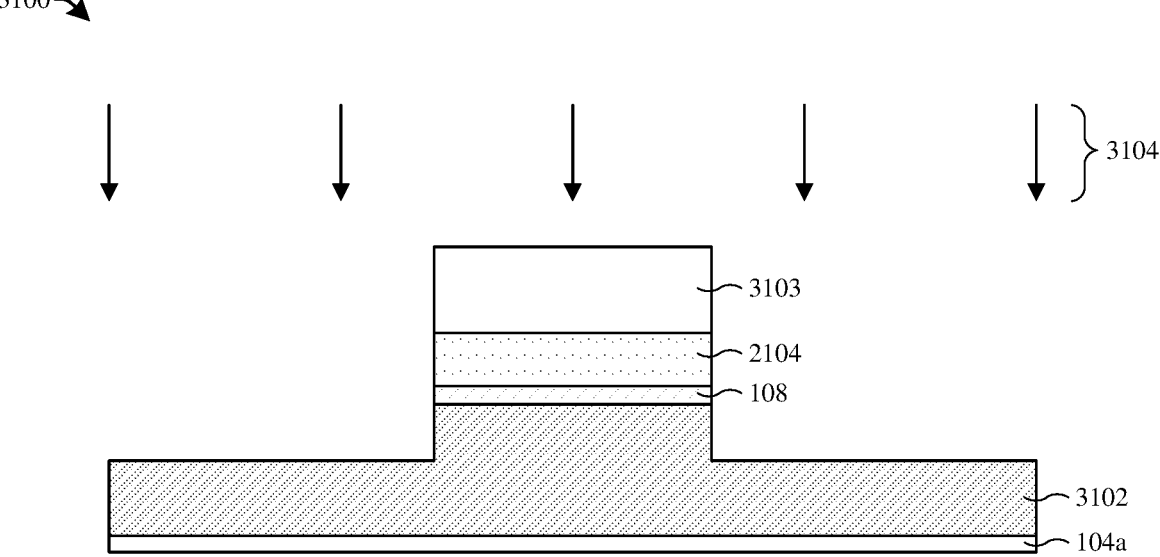

As shown in the cross-sectional view 3100 of FIG. 31, a portion of the first hardmask layer 1806 is removed, thereby forming the third hardmask structure 2104; a portion of the insulator layer 1804 is removed, thereby forming the first insulator structure 108; and a portion of the first heating layer 1802 is removed, thereby forming a sixth heating structure 3102. In some embodiments, a process for forming the third hardmask structure 2104, the first insulator structure 108, and the sixth heating structure 3102 comprises forming a fifth patterned masking layer 3103 over the first hardmask layer 1806 (see, e.g., FIG. 30). The fifth patterned masking layer 3103 may be formed in a substantially similar manner as the first patterned masking layer 1908 (see, e.g., FIG. 19).

Thereafter, with the fifth patterned masking layer 3103 in place, a third etching process 3104 is performed on the first hardmask layer 1806, the insulator layer 1804, and the first heating layer 1802. The third etching process 3104 removes unmasked portions of the first hardmask layer 1806, the insulator layer 1804, and the first heating layer 1802, thereby respectively forming the third hardmask structure 2104, the first insulator structure 108, and the sixth heating structure 3102 according to the fifth patterned masking layer 3103. In some embodiments, the third etching process 3104 may be, for example, a wet etching process, a dry etching process, a RIE process, some other etching process, or a combination of the foregoing. In further embodiments, the fifth patterned masking layer 3103 may be subsequently stripped away.

Figure 32:
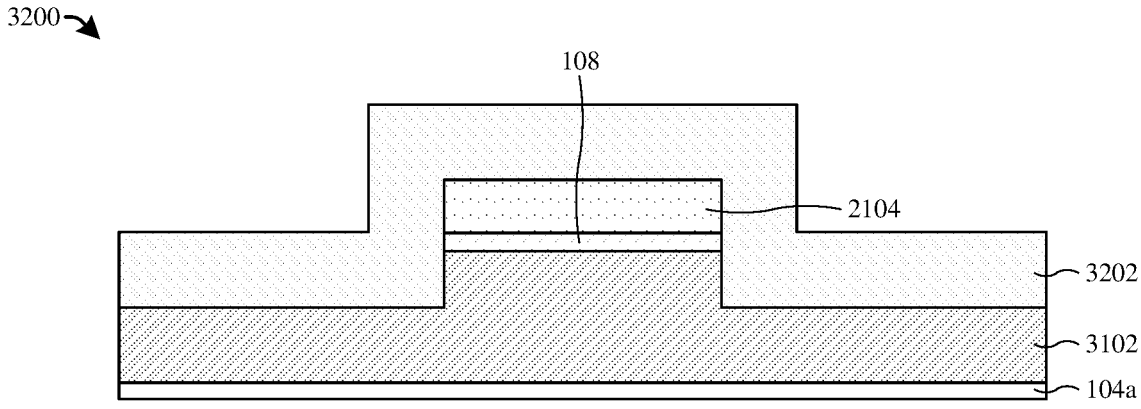

As shown in the cross-sectional view 3200 of FIG. 32, a spacer layer 3202 is formed over the third hardmask structure 2104, the first insulator structure 108, the sixth heating structure 3102, and the first dielectric layer 104a. In some embodiments, the spacer layer 3202 is formed as a conformal layer. In some embodiments, the spacer layer 3202 may be or comprise, for example, an oxide (e.g., $SiO_2$), a nitride (e.g., SiN), an oxynitride (e.g., SiON), some other dielectric material, or a combination of the foregoing. In some embodiments, a process for forming the spacer layer 3202 comprises depositing the spacer layer 3202 over the third hardmask structure 2104, over the first insulator structure 108, and over the sixth heating structure 3102. In some embodiments, the spacer layer 3202 may be formed by, for example, CVD, PVD, ALD, some other deposition process, or a combination of the foregoing.

Figure 33:
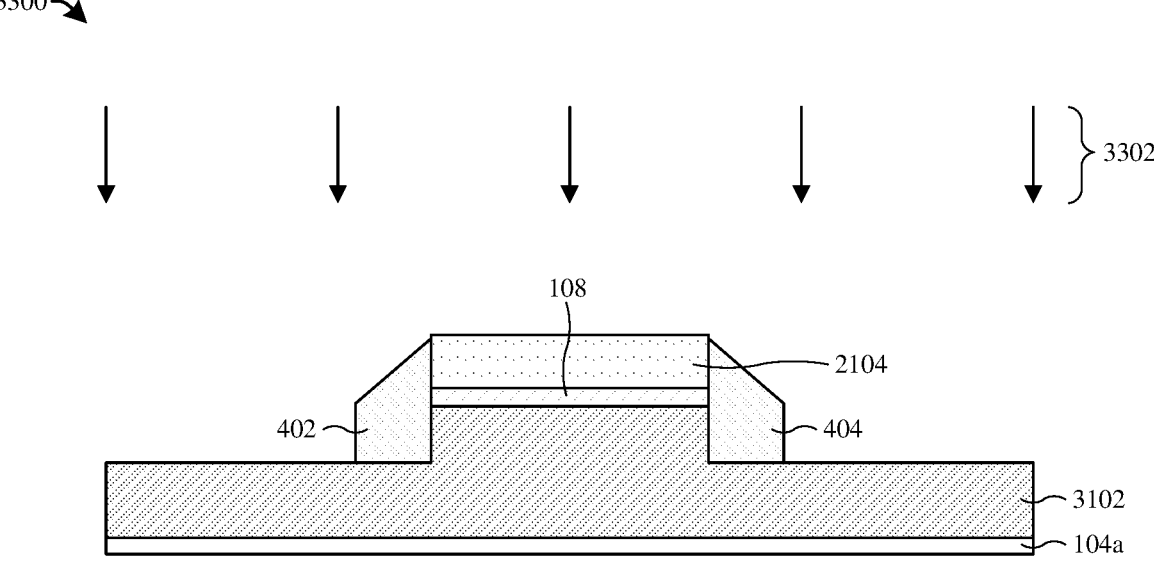

As shown in the cross-sectional view 3300 of FIG. 33, a portion of the spacer layer 3202 is removed, thereby forming a first spacer structure 402 and a second spacer structure 404. The first spacer structure 402 is formed on a first side of the first insulator structure 108. The second spacer structure 404 is formed on a second side of the first insulator structure 108 opposite the first side of the first insulator structure 108. The first spacer structure 402 is formed on a first side of the third hardmask structure 2104. The second spacer structure 404 is formed on a second side of the third hardmask structure 2104 opposite the first side of the third hardmask structure 2104.

In some embodiments, a process for forming the first spacer structure 402 and the second spacer structure 404 comprises performing a fourth etching process 3302 on the spacer layer 3202 (see, e.g., FIG. 32). The fourth etching process 3302 removes horizontal portions of the spacer layer 3202, thereby leaving a first vertical portion of the spacer layer in place as the first spacer structure 402 and a second vertical portion of the spacer layer in place as the second spacer structure 404. In some embodiments, the fourth etching process 3302 may be, for example, a wet etching process, a dry etching process, a RIE process, some other etching process, or a combination of the foregoing.

Figure 34:
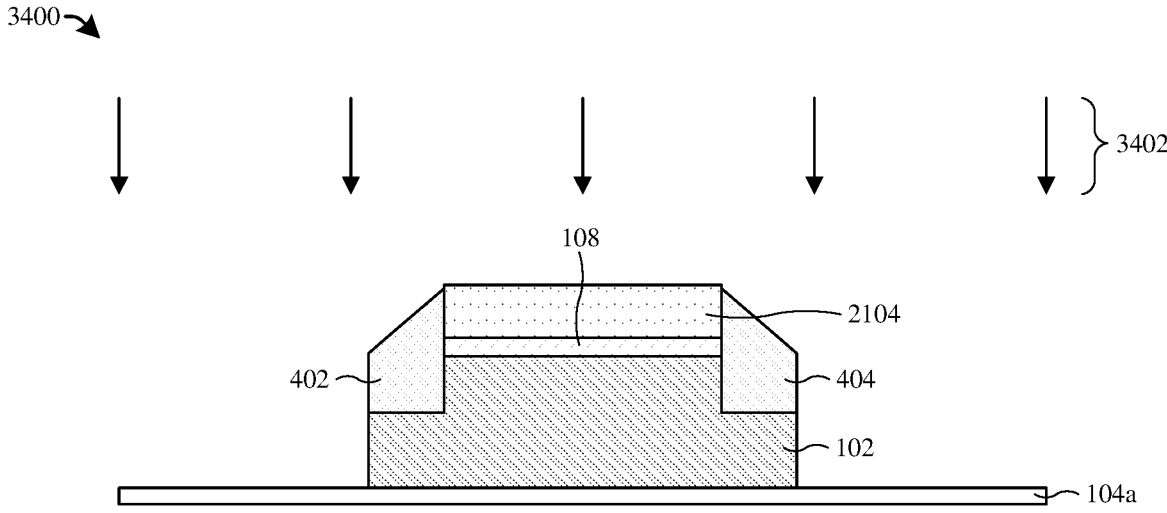

As shown in the cross-sectional view 3400 of FIG. 34, a portion of the sixth heating structure 3102 is removed, thereby forming the first heating structure 102. In some embodiments, a process for forming the first heating structure 102 comprises performing a fifth etching process 3402 on the sixth heating structure 3102. The fifth etching process 3402 is performed with the first spacer structure 402 and the second spacer structure 404 overlying portions of the sixth heating structure 3102. The first spacer structure 402, the second spacer structure 404, and the third hardmask structure 2104 (or the first insulator structure 108) collectively act as a masking layer during the fifth etching process 3402. The fifth etching process 3402 removes unmasked portions (e.g., not masked by the first spacer structure 402, the second spacer structure 404, or the third hardmask structure 2104) of the sixth heating structure 3102, thereby forming the first heating structure 102. In some embodiments, the fifth etching process 3402 may be, for example, a wet etching process, a dry etching process, a RIE process, some other etching process, or a combination of the foregoing.

Figure 35:
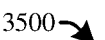
Figure 35:
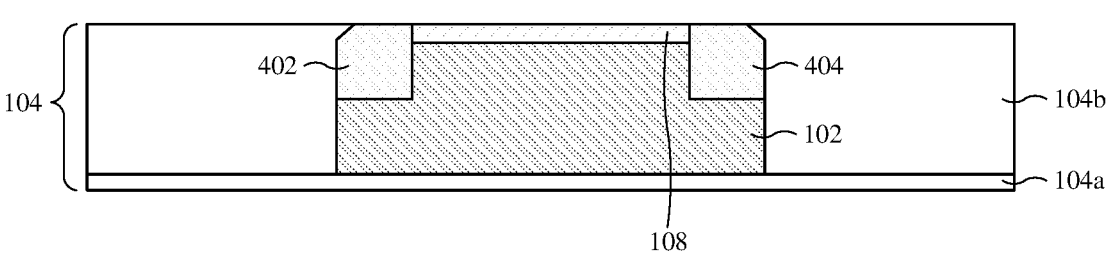

As shown in the cross-sectional view 3500 of FIG. 35, the second dielectric layer 104b is formed over the first dielectric layer 104a. The second dielectric layer 104b is also formed around (e.g., laterally around) the first insulator structure 108, the first spacer structure 402, the second spacer structure 404, and the first heating structure 102. Also shown in the cross-sectional view 3500 of FIG. 35, the third hardmask structure 2104 is removed, an upper portion of the first spacer structure 402 is removed, and an upper portion of the second spacer structure 404 is removed (e.g., via the planarization process utilized to form the second dielectric layer 104b).

Figure 36:
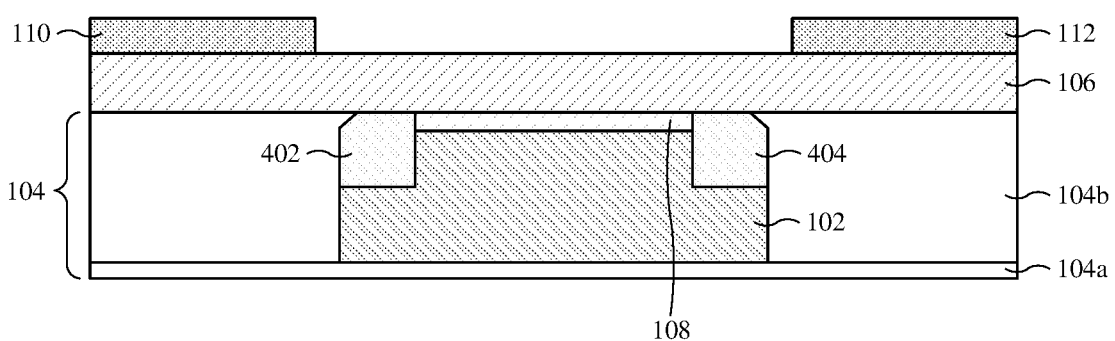

As shown in the cross-sectional view 3600 of FIG. 36, the PCM structure 106 is formed over the second dielectric layer 104b, the first insulator structure 108, the first spacer structure 402, the second spacer structure 404, and the first heating structure 102. The first conductive structure 110 and the second conductive structure 112 may also be formed over and electrically coupled to the PCM structure 106.

In some embodiments, the method for forming the PCM switch having low heater resistance illustrated in FIGS. 30-36 may correspond to a spacer technique (e.g., due to the method utilizing the first spacer structure 402 and the second spacer structure 404 to form the first heating structure 102).

FIGS. 37-43 illustrate a series of cross-sectional views 3700-4300 of some other embodiments of a method for forming a PCM switch having low heater resistance.

Figure 37:
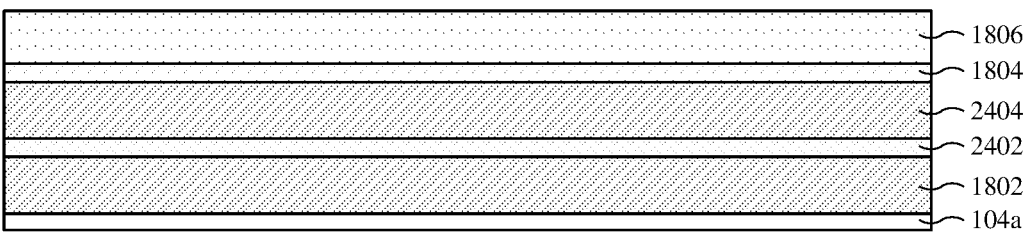
FIGS. 37-43 illustrate a series of cross-sectional views of some other embodiments of a method for forming a PCM switch having low heater resistance.

As shown in the cross-sectional view 3700 of FIG. 37, the first heating layer 1802 is formed over the first dielectric layer 104a. The second etch stop layer 2402 may be formed over the first heating layer 1802. In some embodiments, the second heating layer 2404 is formed over the second etch stop layer 2402. In some embodiments, the insulator layer 1804 is formed over the second heating layer 2404. In some embodiments, the first hardmask layer 1806 is formed over the insulator layer 1804.

Figure 38:
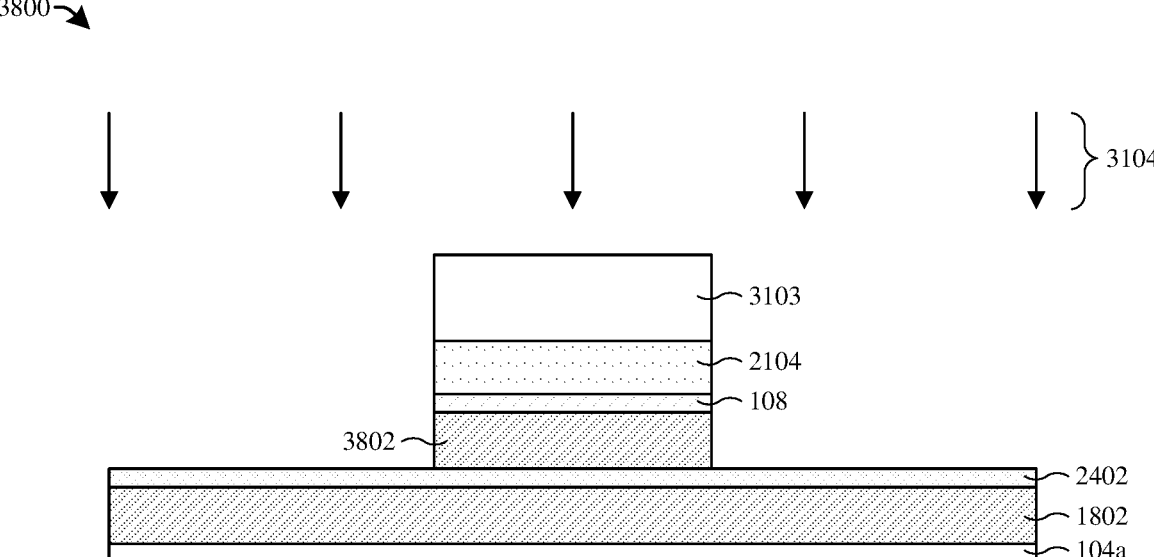

As shown in the cross-sectional view 3800 of FIG. 38, the portion of the first hardmask layer 1806 is removed, thereby forming the third hardmask structure 2104; the portion of the insulator layer 1804 is removed, thereby forming the first insulator structure 108; a portion of the second heating layer 2404 is removed, thereby forming a seventh heating structure 3802.

In some embodiments, a process for forming the third hardmask structure 2104, the first insulator structure 108, and the seventh heating structure 3802 comprises forming the fifth patterned masking layer 3103 over the first hardmask layer 1806 (see, e.g., FIG. 37). Thereafter, with the fifth patterned masking layer 3103 in place, the third etching process 3104 is performed on the first hardmask layer 1806, the insulator layer 1804, and the second heating layer 2404. The third etching process 3104 removes unmasked portions of the first hardmask layer 1806, the insulator layer 1804, and the second heating layer 2404, thereby respectively forming the third hardmask structure 2104, the first insulator structure 108, and the seventh heating structure 3802. In some embodiments, the third etching process 3104 may stop on the second etch stop layer 2402, as shown in the cross-sectional view 3800 of FIG. 38. In such embodiments, the third etching process 3104 may expose the second etch stop layer 2402. In some embodiments, the fifth patterned masking layer 3103 may be subsequently stripped away.

Figure 39:
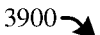
Figure 39:
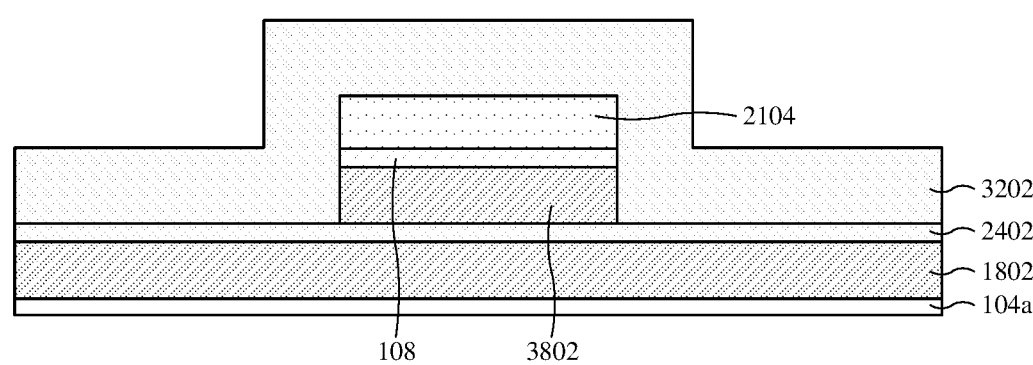

As shown in the cross-sectional view 3900 of FIG. 39, the spacer layer 3202 is formed over the third hardmask structure 2104, the first insulator structure 108, the seventh heating structure 3802, the second etch stop layer 2402, the first heating layer 1802, and the first dielectric layer 104*a*.

Figure 40:
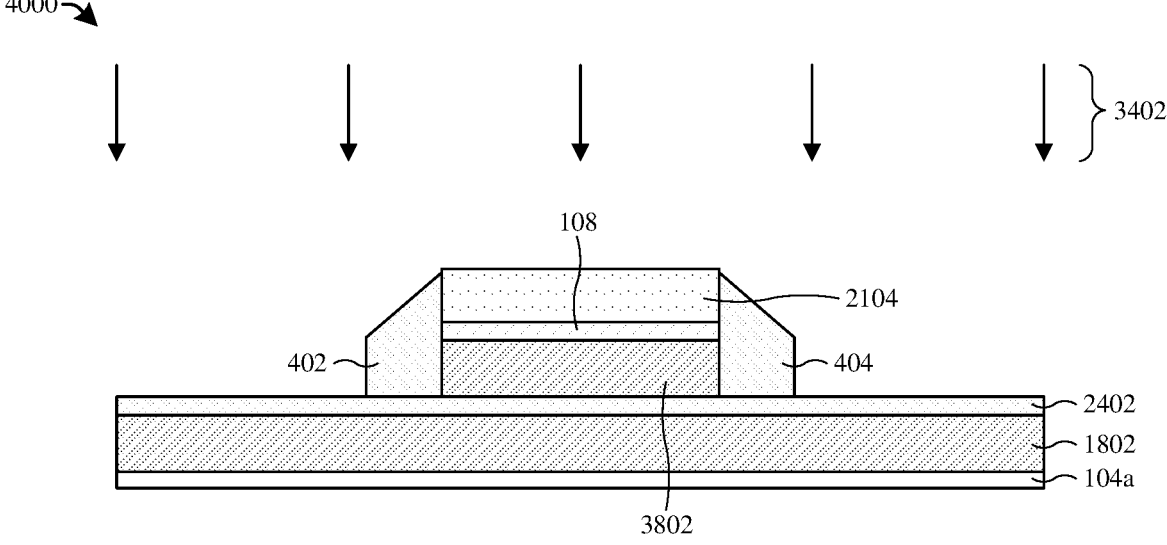

As shown in the cross-sectional view 4000 of FIG. 40, the portion of the spacer layer 3202 is removed, thereby forming the first spacer structure 402 and the second spacer structure 404. The first spacer structure 402 and the second spacer structure 404 are formed over the second etch stop layer 2402. In some embodiments, the fifth etching process 3402 stops on the second etch stop layer 2402. In other embodiments, the fifth etching process 3402 stops on the first heating layer 1802.

Figure 41:
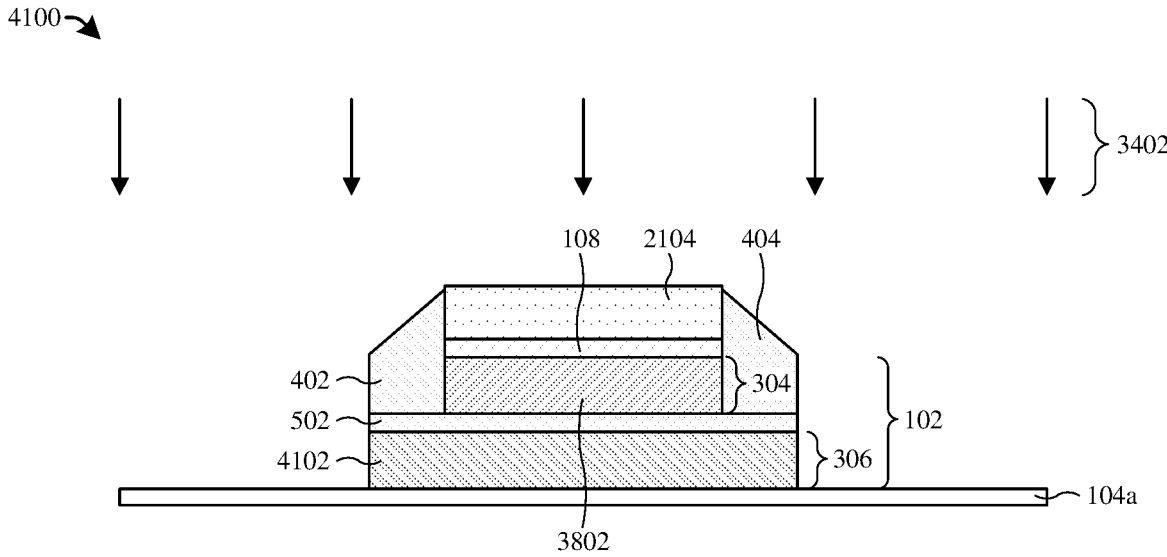

As shown in the cross-sectional view 4100 of FIG. 41, a portion of the second etch stop layer 2402 is removed, thereby forming the etch stop structure 502. Also shown in the cross-sectional view 4100 of FIG. 41, a portion of the first heating layer 1802 is removed, thereby forming an eighth heating structure 4102. In some embodiments, the seventh heating structure 3802 corresponds to a first portion 304 of a first heating structure 102. In further embodiments, the eighth heating structure 4102 corresponds to a second portion 306 of the first heating structure 102. In yet further embodiments, forming the eighth heating structure 4102 may complete formation of the first heating structure 102.

In some embodiments, a process for forming the etch stop structure 502 and the eighth heating structure 4102 comprises performing the fifth etching process 3402 on the second etch stop layer 2402 and the first heating layer 1802. The fifth etching process 3402 is performed with the first spacer structure 402 and the second spacer structure 404 overlying portions of the second etch stop layer 2402 and portions of the first heating layer 1802. The first spacer structure 402, the second spacer structure 404, and the third hardmask structure 2104 (or the first insulator structure 108) collectively act as a masking layer during the fifth etching process 3402. The fifth etching process 3402 removes unmasked portions (e.g., not masked by the first spacer structure 402, the second spacer structure 404, or the third hardmask structure 2104) of the second etch stop layer 2402 and unmasked portions of the first heating layer 1802, thereby respectively forming the etch stop structure 502 and the eighth heating structure 4102.

Figure 42:
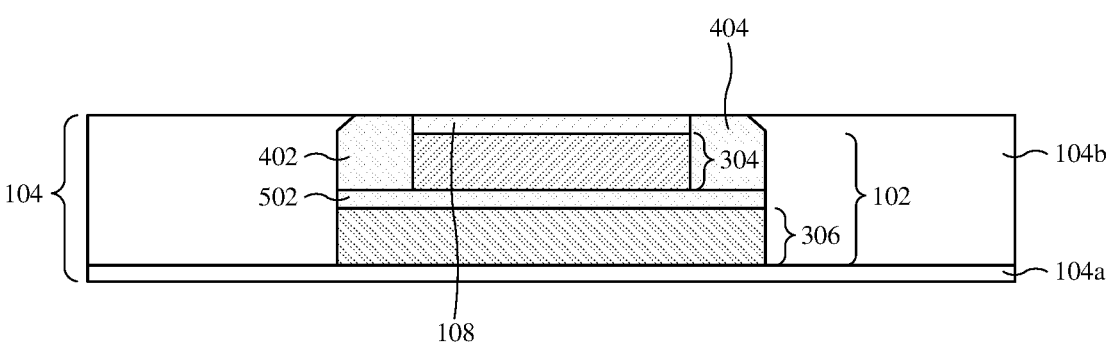

As shown in the cross-sectional view 4200 of FIG. 42, the second dielectric layer 104*b* is formed over the first dielectric layer 104*a*. The second dielectric layer 104*b* is also formed around (e.g., laterally around) the first insulator structure 108, the first spacer structure 402, the second spacer structure 404, the etch stop structure 502, and the first heating structure 102. Also shown in the cross-sectional view 4200 of FIG. 42, the third hardmask structure 2104 is removed, the upper portion of the first spacer structure 402 is removed, and the upper portion of the second spacer structure 404 is removed (e.g., via the planarization process utilized to form the second dielectric layer 104*b*).

Figure 43:
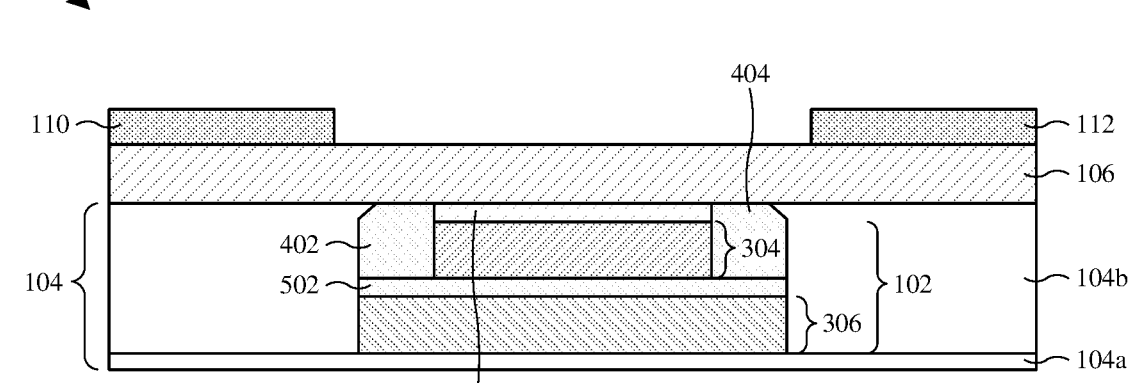

As shown in the cross-sectional view 4300 of FIG. 43, the PCM structure 106 is formed over the second dielectric layer 104*b*, the first insulator structure 108, the first spacer structure 402, the second spacer structure 404, the etch stop structure 502, and the first heating structure 102. The first conductive structure 110 and the second conductive structure 112 may also be formed over and electrically coupled to the PCM structure 106.

In some embodiments, the method for forming the PCM switch having low heater resistance illustrated in FIGS. 37-43 may correspond to another spacer technique (e.g., due to the method utilizing the first spacer structure 402 and the second spacer structure 404 to form the first heating structure 102).

FIGS. 44-52 illustrate a series of cross-sectional view 4400-5200 of some embodiments of a method for forming an integrated chip (IC) comprising a PCM switch having low heater resistance.

Figure 44:
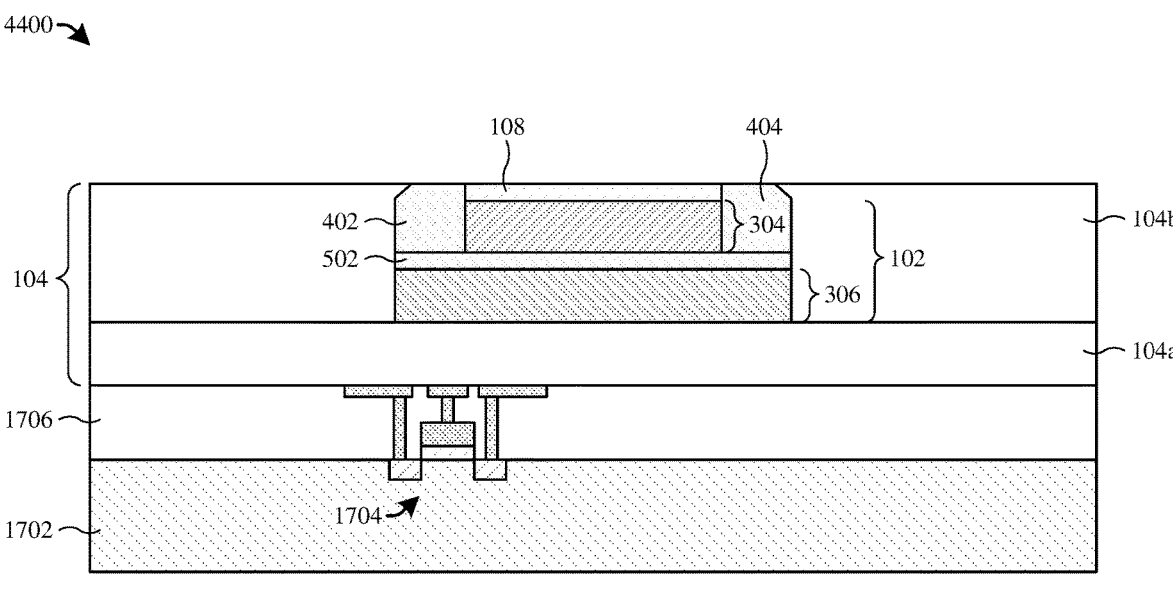
FIGS. 44-52 illustrate a series of cross-sectional view of some embodiments of a method for forming an IC comprising a PCM switch having low heater resistance.

As shown in the cross-sectional view 4400 of FIG. 44, a workpiece is received. In some embodiments, the workpiece comprises a substrate 1702 and a fifth dielectric structure 1706 disposed over the substrate 1702. In further embodiments, the workpiece comprises a first dielectric layer 104*a* disposed over the fifth dielectric structure 1706. In yet further embodiments, the workpiece comprises one or more semiconductor devices 1704 disposed on/over the substrate 1702.

Also shown in the cross-sectional view 4400 of FIG. 44, a second dielectric layer 104*b*, a first heating structure 102, an etch stop structure 502, a first spacer structure 402, a second spacer structure 404, and a first insulator structure 108 are formed over the first dielectric layer 104*a*. FIGS. 37-43 illustrate a series of cross-sectional views 3700-4300 of some embodiments of a method for forming the second dielectric layer 104*b*, the first heating structure 102, the etch stop structure 502, the first spacer structure 402, the second spacer structure 404, and the first insulator structure 108. It will be appreciated that other embodiments of the first heating structure 102 (and accompanying structures) may be formed over the first dielectric layer 104*a* (see, e.g., FIGS. 4-15 and FIGS. 18-36).

Figure 45:
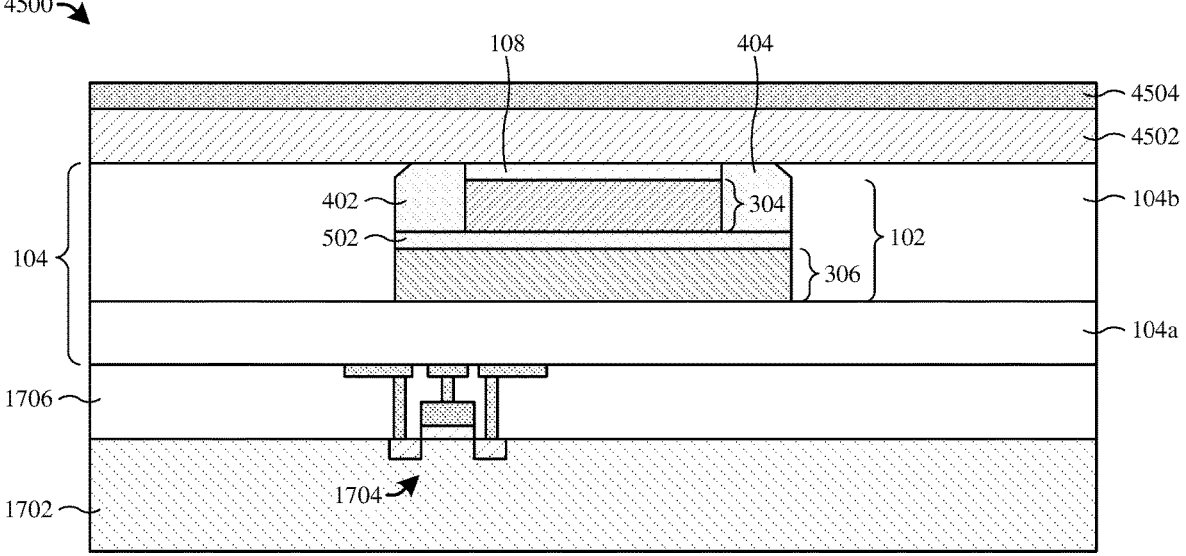

As shown in the cross-sectional view 4500 of FIG. 45, a PCM layer 4502 is formed over the second dielectric layer 104*b*, the first spacer structure 402, the second spacer structure 404, the first heating structure 102, and the first insulator structure 108. In some embodiments, a process for forming the PCM layer 4502 comprises depositing and/or growing the PCM layer 4502 on the second dielectric layer 104*b* and the first insulator structure 108. In some embodiments, the PCM layer 4502 may be or comprise, for example, germanium telluride (GeTe), germanium antimony telluride (GeSbTe), vanadium oxide (VO₂), some other material capable of changing resistive states by changing phases, or a combination of the foregoing. In some embodiments, the PCM layer 4502 may be formed by, for example, CVD, PVD, ALD, sputtering, an epitaxial process, some other deposition or growth process, or a combination of the foregoing.

Also shown in the cross-sectional view 4500 of FIG. 45, a first conductive layer 4504 is formed over the PCM layer 4502. In some embodiments, a process for forming the first conductive layer 4504 comprises depositing the first conductive layer 4504 on the PCM layer 4502. In some embodiments, the first conductive layer 4504 may be or comprise, for example, a metal (e.g., tungsten (W), copper (Cu), gold (Au), silver (Ag), or the like), a metal nitride (e.g., TiN, TaN, or the like), some other conductive material, or a combination of the foregoing. In some embodiments, the first conductive layer 4504 may be formed by, for example, CVD, PVD, ALD, sputtering, electrochemical plating, electroless plating, some other deposition process, or a combination of the foregoing.

Figures 46, 47:
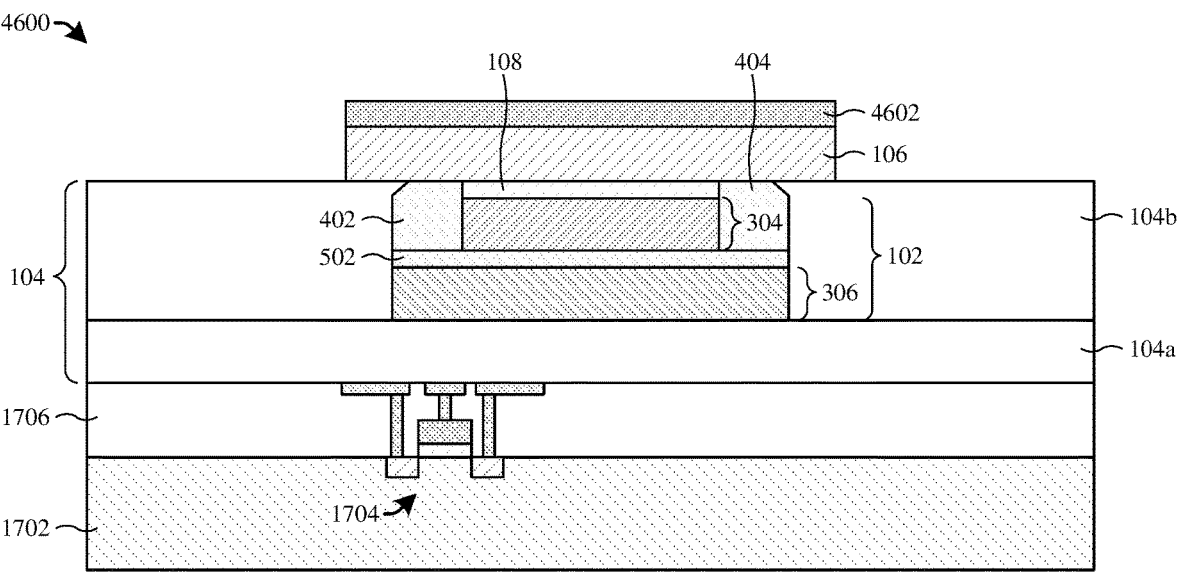

As shown in the cross-sectional view 4600 of FIG. 46, a PCM structure 106 is formed over the second dielectric layer 104*b*, the first spacer structure 402, the second spacer structure 404, the first heating structure 102, and the first insulator structure 108. Also shown in the cross-sectional view 4600 of FIG. 46, a fifth conductive structure 4602 is formed over the PCM structure 106. In some embodiments, the fifth conductive structure 4602 may be formed with a substantially similar footprint (when viewed from a top view) as the PCM structure 106.

In some embodiments, a process for forming the PCM structure 106 and the fifth conductive structure 4602 comprises forming a sixth patterned masking layer (not shown) (e.g., positive/negative photoresist, a hardmask, etc.) over the first conductive layer 4504. Thereafter, an etching process (e.g., wet etching process, dry etching process, RIE process, etc.) may be performed on the first conductive layer 4504 and the PCM layer 4502. The etching process removes unmasked portions of the first conductive layer 4504 and the PCM layer 4502, thereby respectively forming the fifth conductive structure 4602 and the PCM structure 106 according to the sixth patterned masking layer. In further embodiments, the sixth patterned masking layer may be subsequently stripped away.

As shown in the cross-sectional view 4700 of FIG. 47, a third dielectric structure 1602 is formed over the second dielectric layer 104*b*, along a first sidewall of the PCM structure 106, and along a first sidewall of the fifth conductive structure 4602. Also shown in the cross-sectional view 4700 of FIG. 47, a fourth dielectric structure 1604 is formed over the second dielectric layer 104*b*, along a second sidewall of the PCM structure 106, and along a second sidewall of the fifth conductive structure 4602. The second sidewall of the PCM structure 106 is opposite the first sidewall of the PCM structure 106. The second sidewall of the fifth conductive structure 4602 is opposite the first sidewall of the fifth conductive structure 4602.

In some embodiments, a process for forming the third dielectric structure 1602 and the fourth dielectric structure 1604 comprises forming a third dielectric layer (not shown) over the second dielectric layer 104*b*, the PCM structure 106, and the fifth conductive structure 4602. In some embodiments, the third dielectric layer is formed as a conformal layer. In some embodiments, the third dielectric layer may be or comprise, for example, an oxide (e.g., SiO₂), a nitride (e.g., SiN), an oxynitride (e.g., SiON), some other dielectric material, or a combination of the foregoing. In some embodiments, the third dielectric layer may be formed by, for example, CVD, PVD, ALD, some other deposition process, or a combination of the foregoing. Thereafter, an etching process (e.g., a wet etching process, a dry etching process, a RIE process) is performed on the third dielectric layer. The etching process removes horizontal portions of the third dielectric layer, thereby leaving a first vertical portion of the third dielectric layer in place as the third dielectric structure 1602 and a second vertical portion of the third dielectric layer in place as the fourth dielectric structure 1604.

Figures 48, 49:
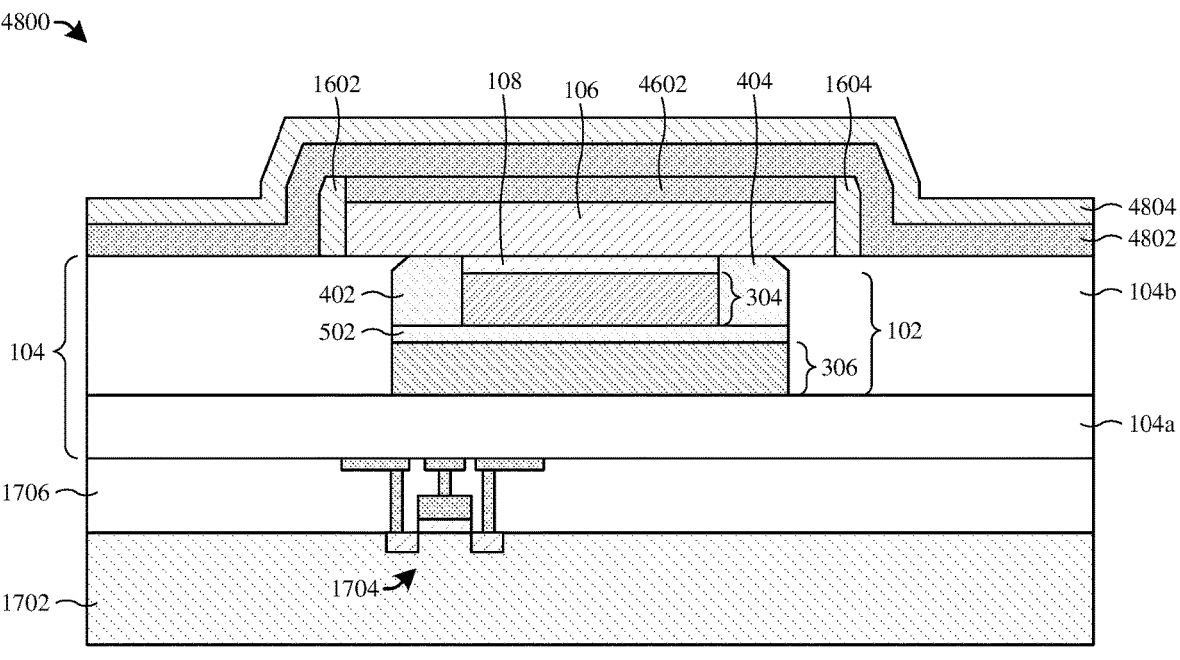

As shown in the cross-sectional view 4800 of FIG. 48, a second conductive layer 4802 is formed over the second dielectric layer 104*b*, the third dielectric structure 1602, the fourth dielectric structure 1604, the PCM structure 106, and the fifth conductive structure 4602. In some embodiments, the second conductive layer 4802 is formed as a conformal layer. In some embodiments, a process for forming the second conductive layer 4802 comprises depositing the second conductive layer 4802 on the second dielectric layer 104*b*, the third dielectric structure 1602, the fourth dielectric structure 1604, and the fifth conductive structure 4602. In some embodiments, the second conductive layer 4802 may be or comprise, for example, a metal (e.g., tungsten (W), copper (Cu), gold (Au), silver (Ag), or the like), a metal nitride (e.g., TiN, TaN, or the like), some other conductive material, or a combination of the foregoing. In some embodiments, the second conductive layer 4802 may be formed by, for example, CVD, PVD, ALD, sputtering, electrochemical plating, electroless plating, some other deposition process, or a combination of the foregoing.

Also shown in the cross-sectional view 4800 of FIG. 48, a first capping layer 4804 is formed over the second conductive layer 4802. In some embodiments, a process for forming the first capping layer 4804 comprises depositing or growing the first capping layer 4804 on the second conductive layer 4802. In some embodiments, the first capping layer 4804 is formed as a conformal layer. In some embodiments, the first capping layer 4804 may be or comprises, for example, an oxide (e.g., SiO₂), a nitride (e.g., SiN), an oxynitride (e.g., SiON), or the like. In some embodiments, the first capping layer 4804 may be formed by, for example, CVD, PVD, ALD, thermal oxidation, some other deposition or growth process, or a combination of the foregoing.

As shown in the cross-sectional view 4900 of FIG. 49, portions of the first capping layer 4804 are removed, thereby forming a third capping structure 4902 and a fourth capping structure 4904; portions of the second conductive layer 4802 are removed, thereby forming a sixth conductive structure 4906 and a seventh conductive structure 4908; and portions of the fifth conductive structure 4602 are removed, thereby forming an eighth conductive structure 4910 and a ninth conductive structure 4912. In some embodiments, the portions of the first capping layer 4804 that are removed comprise a portion of the first capping layer 4804 disposed laterally between the third dielectric structure 1602 and the fourth dielectric structure 1604. In some embodiments, the portions of the second conductive layer 4802 that are removed comprise a portion of the second conductive layer 4802 disposed laterally between the third dielectric structure 1602 and the fourth dielectric structure 1604. In some embodiments, the portions of the fifth conductive structure 4602 that are removed comprise a portion of the fifth conductive structure 4602 disposed laterally between the third dielectric structure 1602 and the fourth dielectric structure 1604.

The eighth conductive structure 4910 is formed laterally between the third dielectric structure 1602 and the fourth dielectric structure 1604. The eighth conductive structure 4910 is formed overlying a first portion of the PCM structure 106. The ninth conductive structure 4912 is formed laterally between the third dielectric structure 1602 and the fourth dielectric structure 1604. The ninth conductive structure 4912 is formed overlying a second portion of the PCM structure 106. The ninth conductive structure 4912 is formed laterally spaced from the eighth conductive structure 4910.

The sixth conductive structure 4906 is formed electrically coupled to the eighth conductive structure 4910. The seventh conductive structure 4908 is formed electrically coupled to the ninth conductive structure 4912. The sixth conductive structure 4906 is formed overlying the eighth conductive structure 4910, the first portion of the PCM structure 106, the third dielectric structure 1602, and the second dielectric layer 104b. The seventh conductive structure 4908 is formed overlying the ninth conductive structure 4912, the second portion of the PCM structure 106, the fourth dielectric structure 1604, and the second dielectric layer 104b.

The third capping structure 4902 is formed overlying the sixth conductive structure 4906, the eighth conductive structure 4910, the third dielectric structure 1602, the second dielectric layer 104b, and the first portion of the PCM structure 106. The fourth capping structure 4904 is formed overlying the seventh conductive structure 4908, the ninth conductive structure 4912, the fourth dielectric structure 1604, the second dielectric layer 104b, and the second portion of the PCM structure 106. In some embodiments, the third capping structure 4902 may be formed with a substantially similar footprint (when viewed from a top view) as the sixth conductive structure 4906. In some embodiments, the fourth capping structure 4904 may be formed with a substantially similar footprint (when viewed from a top view) as the seventh conductive structure 4908. In further embodiments, the sixth conductive structure 4906 and the eighth conductive structure 4910 may collectively from a first conductive structure 110 (see, e.g., FIG. 16). In yet further embodiments, the seventh conductive structure 4908 and the ninth conductive structure 4912 may collectively from a second conductive structure 112 (see, e.g., FIG. 16).

In some embodiments, a process for forming the third capping structure 4902, the fourth capping structure 4904, the sixth conductive structure 4906, the seventh conductive structure 4908, the eighth conductive structure 4910, and the ninth conductive structure 4912 comprises forming a seventh patterned masking layer (not shown) (e.g., positive/negative photoresist, a hardmask, etc.) over the first capping layer 4804 (see, e.g., FIG. 48). Thereafter, an etching process (e.g., wet etching process, dry etching process, RIE process, etc.) may be performed on the first capping layer 4804, the second conductive layer 4802, and the fifth conductive structure 4602. The etching process removes unmasked portions of the first capping layer 4804, thereby forming the third capping structure 4902 and the fourth capping structure 4904; the etching process removes unmasked portions of the second conductive layer 4802, thereby forming the sixth conductive structure 4906 and the seventh conductive structure 4908; and the etching process removes unmasked portions of the fifth conductive structure 4602, thereby forming the eighth conductive structure 4910 and the ninth conductive structure 4912. In further embodiments, the seventh patterned masking layer may be subsequently stripped away.

Figure 50:
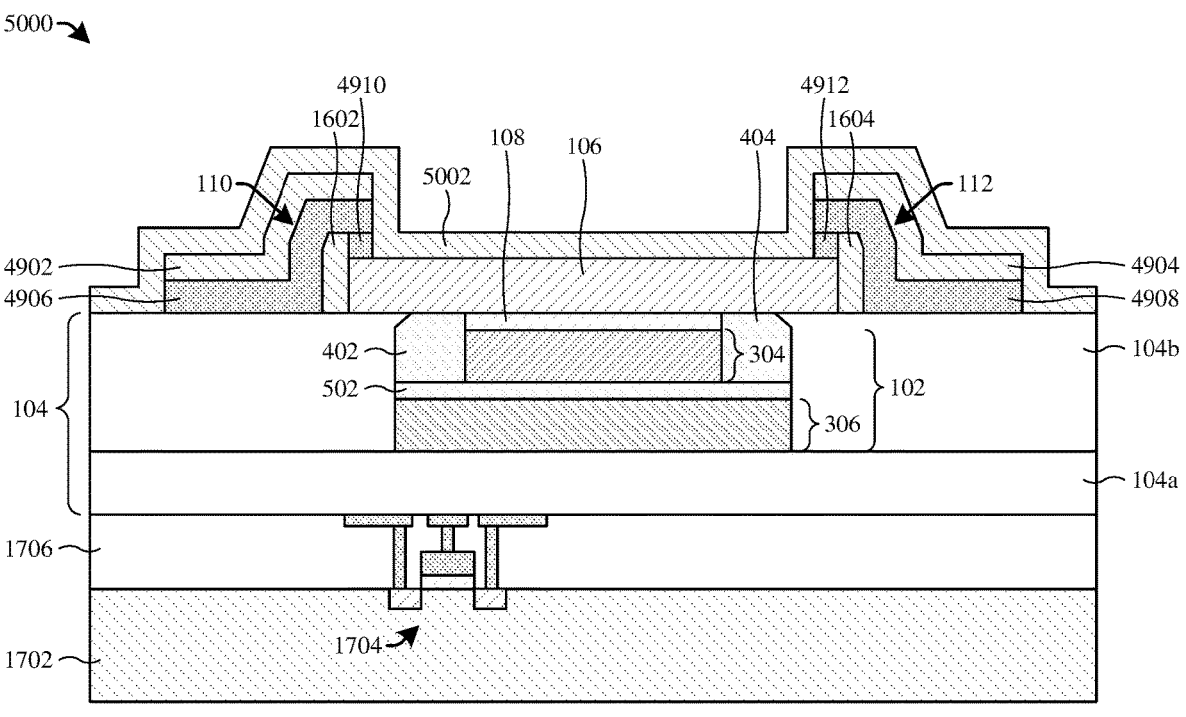

As shown in the cross-sectional view 5000 of FIG. 50, a second capping layer 5002 is formed over the second dielectric layer 104b, the third capping structure 4902, the fourth capping structure 4904, the sixth conductive structure 4906, the seventh conductive structure 4908, the eighth conductive structure 4910, the ninth conductive structure 4912, the third dielectric structure 1602, the fourth dielectric structure 1604, and the PCM structure 106. In some embodiments, a process for forming the second capping layer 5002 comprises depositing the second capping layer 5002 on the second dielectric layer 104b, the third capping structure 4902, the fourth capping structure 4904, the sixth conductive structure 4906, the seventh conductive structure 4908, the eighth conductive structure 4910, the ninth conductive structure 4912, and the PCM structure 106. In some embodiments, the second capping layer 5002 is formed as a conformal layer.

In some embodiments, the second capping layer 5002 may be or comprises, for example, an oxide (e.g., $SiO_2$), a nitride (e.g., SiN), an oxynitride (e.g., SiON), or the like. In some embodiments, the second capping layer 5002 may be formed by, for example, CVD, PVD, ALD, thermal oxidation, some other deposition or growth process, or a combination of the foregoing. In further embodiments, the second capping layer 5002 may be formed with a same chemical composition (e.g., same material(s)) as the first capping layer 4804. In yet further embodiments, the second capping layer 5002, the third capping structure 4902, and the fourth capping structure 4904 collectively form a second capping structure 1608 (see, e.g., FIG. 16).

Figure 51:
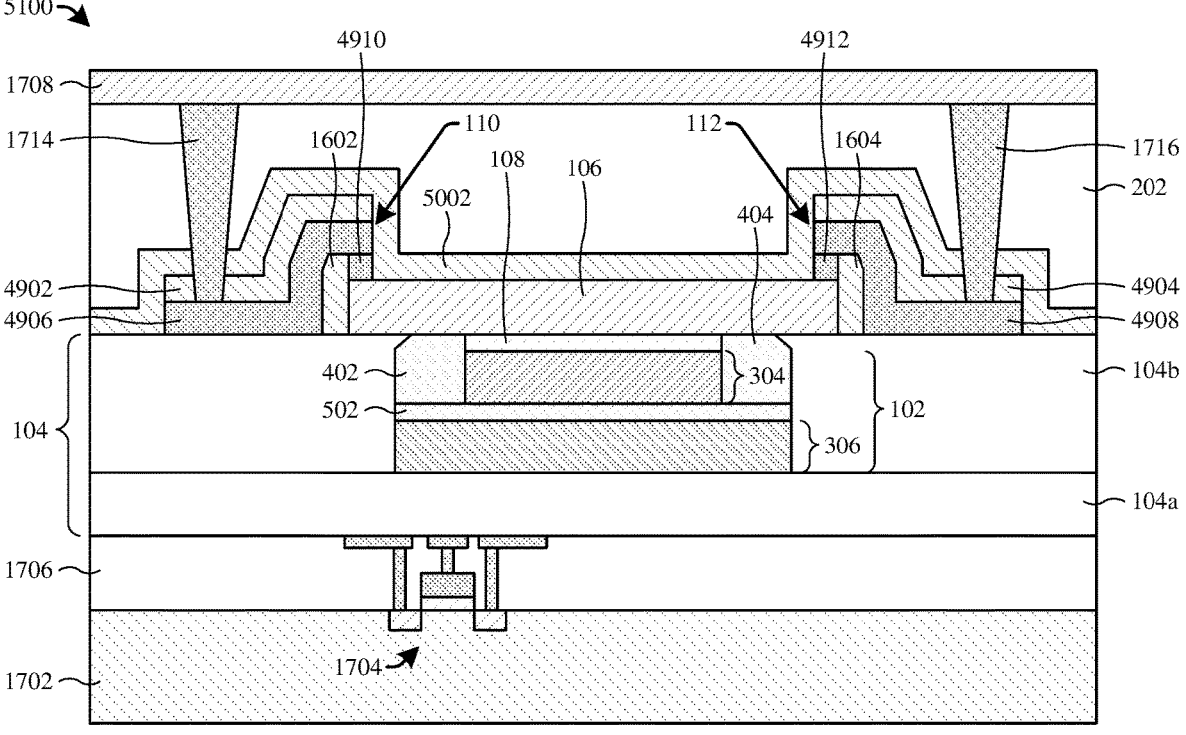

As shown in the cross-sectional view 5100 of FIG. 51, a second dielectric structure 202 is formed over the second capping layer 5002. In some embodiments, the second dielectric structure 202 comprises one or more stacked dielectric layers, which may respectively comprise an oxide (e.g., $SiO_2$), a low-k dielectric, or the like. In some embodiments, a process for forming the second dielectric structure 202 comprises depositing (e.g., via CVD, PVD, ALD, some other deposition process, or a combination of the foregoing) the one or more dielectric layers over the second capping layer 5002. In further embodiments, a planarization process (e.g., CMP, an etch back process, etc.) may be performed on the second dielectric structure 202 to planarize an upper surface of the second dielectric structure 202.

Also shown in the cross-sectional view 5100 of FIG. 51, a first conductive via 1714 and a second conductive via 1716 are formed in the second dielectric structure 202. The first conductive via 1714 is formed electrically coupled to the sixth conductive structure 4906. The second conductive via 1716 is formed electrically coupled to the seventh conductive structure 4908. In some embodiments, the first conductive via 1714 is also formed in the second capping layer 5002 and the third capping structure 4902. In some embodiments, the second conductive via 1716 is also formed in the second capping layer 5002 and the fourth capping structure 4904.

In some embodiments, a process for forming the first conductive via 1714 and the second conductive via 1716 comprises forming a first via opening that extends vertically through the second dielectric structure 202, the second capping layer 5002, and the third capping structure 4902 to expose the sixth conductive structure 4906, and comprises forming a second via opening that extends vertically through the second dielectric structure 202, the second capping layer 5002, and the fourth capping structure 4904 to expose the seventh conductive structure 4908. A conductive material (e.g., copper (Cu), gold (Au), silver (Ag), tungsten (W), or the like) is then formed on the second dielectric structure 202 and in both the first via opening and the second via opening. Thereafter, a planarization process (e.g., CMP) is performed on the conductive material to form the first conductive via 1714 in the first via opening and the second conductive via 1716 in the second via opening.

Also shown in the cross-sectional view 5100 of FIG. 51, a first etch stop layer 1708 may be formed over the second dielectric structure 202, the first conductive via 1714, and the second conductive via 1716. The first etch stop layer 1708 may be or comprise, for example, an oxide (e.g., SiO$_2$), a nitride (e.g., SiN), an oxynitride (e.g., SiON), or the like. In some embodiments, a process for forming the first etch stop layer 1708 comprises depositing the first etch stop layer 1708 on the second dielectric structure 202, the first conductive via 1714, and the second conductive via 1716. The first etch stop layer 1708 may be formed by, for example, CVD, PVD, ALD, sputtering, some other deposition process, or a combination of the foregoing.

Figure 52:
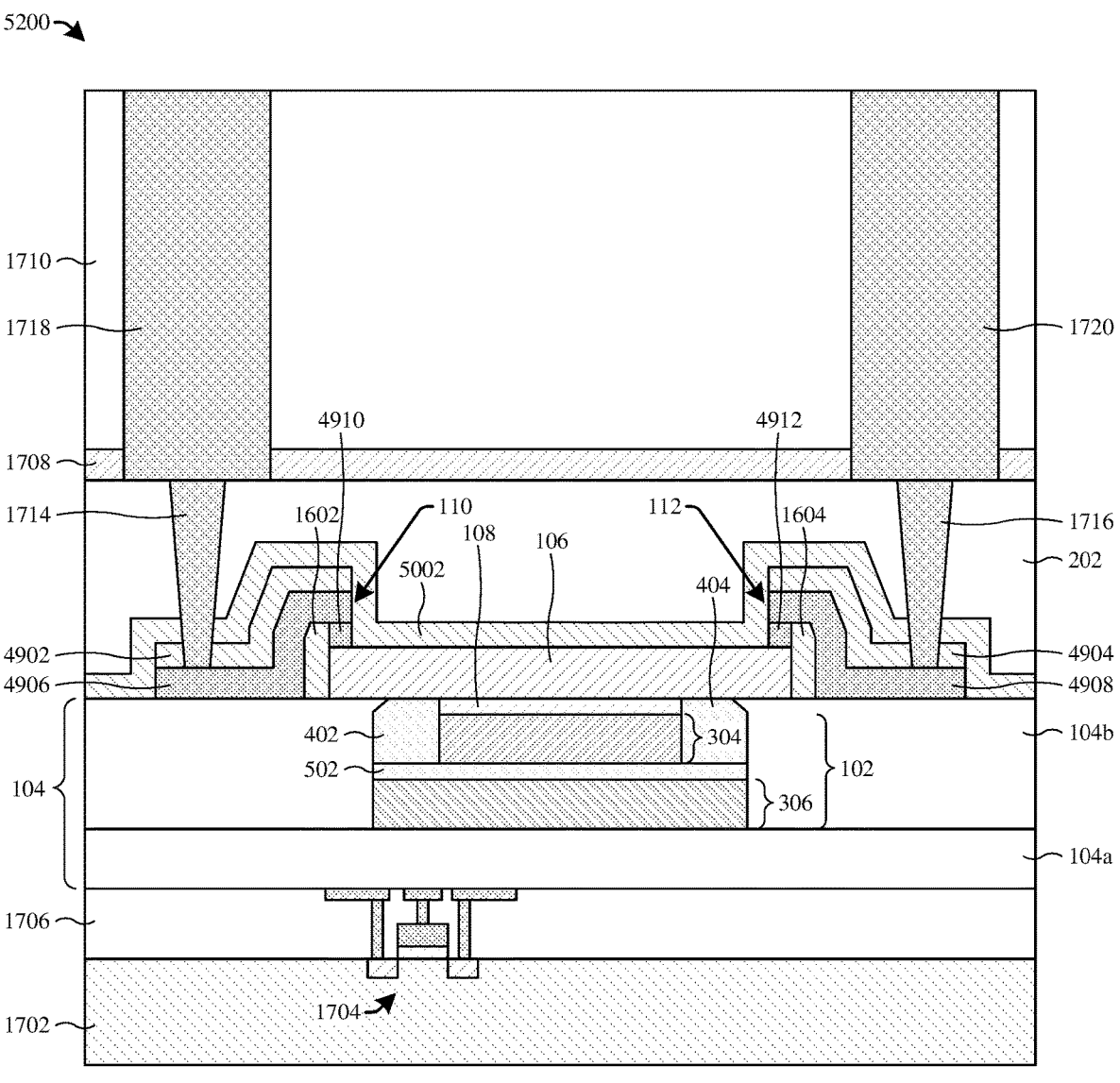

As shown in the cross-sectional view 5200 of FIG. 52, a sixth dielectric structure 1710 is formed over the first etch stop layer 1708. In some embodiments, the sixth dielectric structure 1710 comprises one or more stacked dielectric layers, which may respectively comprise an oxide (e.g., SiO$_2$), a low-k dielectric, or the like. In some embodiments, a process for forming the sixth dielectric structure 1710 comprises depositing (e.g., via CVD, PVD, ALD, some other deposition process, or a combination of the foregoing) the one or more dielectric layers over the first etch stop layer 1708. In further embodiments, a planarization process (e.g., CMP, an etch back process, etc.) may be performed on the sixth dielectric structure 1710 to planarize an upper surface of the sixth dielectric structure 1710.

Also shown in the cross-sectional view 5200 of FIG. 52, a third conductive structure 1718 and a fourth conductive structure 1720 are formed in the sixth dielectric structure 1710. The third conductive structure 1718 is formed electrically coupled to the first conductive via 1714. The fourth conductive structure 1720 is formed electrically coupled to the second conductive via 1716. In some embodiments, the third conductive structure 1718 is also formed in the first etch stop layer 1708. In some embodiments, the fourth conductive structure 1720 is also formed in the first etch stop layer 1708.

In some embodiments, a process for forming the third conductive structure 1718 and the fourth conductive structure 1720 comprises forming a first opening that extends vertically through the sixth dielectric structure 1710 and the first etch stop layer 1708 to expose the first conductive via 1714, and comprises forming a second opening that extends vertically through the sixth dielectric structure 1710 and the first etch stop layer 1708 to expose the second conductive via 1716. A conductive material (e.g., copper (Cu), gold (Au), silver (Ag), tungsten (W), or the like) is then formed on the sixth dielectric structure 1710 and in both the first opening and the second opening. Thereafter, a planarization process (e.g., CMP) is performed on the conductive material to form the third conductive structure 1718 in the first opening and the fourth conductive structure 1720 in the second opening.

FIG. 53 illustrates a flowchart 5300 of some embodiments of a method for forming an IC comprising a PCM switch having low heater resistance. While the flowchart 5300 of FIG. 53 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 5302, a workpiece comprising a first dielectric structure over a substrate is received. FIG. 44 illustrates a cross-sectional view 4400 of some embodiments corresponding to act 5302.

At act 5304, a heating structure is formed over the first dielectric structure. In some embodiments, FIG. 44 illustrates a cross-sectional view 4400 of some embodiments corresponding to act 5304. In other embodiments, FIGS. 18-21 illustrate a series of cross-sectional views 1800-2100 of some embodiments corresponding to act 5304. In other embodiments, FIGS. 24-27 illustrate a series of cross-sectional views 2400-2700 of some embodiments corresponding to act 5304. In other embodiments, FIGS. 30-34 illustrate a series of cross-sectional views 3000-3400 of some embodiments corresponding to act 5304. In other embodiments, FIGS. 37-41 illustrate a series of cross-sectional views 3700-4100 of some embodiments corresponding to act 5304.

At act 5306, a second dielectric structure is formed over the first dielectric structure and around the heating structure. In some embodiments, FIG. 44 illustrates a cross-sectional view 4400 of some embodiments corresponding to act 5306. In other embodiments, FIG. 22 illustrates a cross-sectional view 2200 of some embodiments corresponding to act 5306. In other embodiments, FIG. 28 illustrates a cross-sectional view 2800 of some embodiments corresponding to act 5306. In some embodiments, FIG. 35 illustrates a cross-sectional view 3500 of some embodiments corresponding to act 5306. In some embodiments, FIG. 42 illustrates a cross-sectional view 4200 of some embodiments corresponding to act 5306.

At act 5308, a phase change material (PCM) structure is formed over the heating structure. In some embodiments, FIGS. 45-46 illustrate a series of cross-sectional views 4500-4600 of some embodiments corresponding to act 5308. In other embodiments, FIG. 23 illustrates a cross-sectional view 2300 of some embodiments corresponding to act 5308. In other embodiments, FIG. 29 illustrates a cross-sectional view 2900 of some embodiments corresponding to act 5308. In other embodiments, FIG. 36 illustrates a cross-sectional view 3600 of some embodiments corresponding to act 5308. In other embodiments, FIG. 43 illustrates a cross-sectional view 4300 of some embodiments corresponding to act 5308.

At act 5310, a first conductive structure is formed electrically coupled to the PCM structure. In some embodiments, FIGS. 45-49 illustrate a series of cross-sectional views 4500-4900 of some embodiments corresponding to act 5310. In other embodiments, FIG. 23 illustrates a cross-sectional view 2300 of some embodiments corresponding to act 5310. In other embodiments, FIG. 29 illustrates a cross-sectional view 2900 of some embodiments corresponding to act 5310. In other embodiments, FIG. 36 illustrates a cross-sectional view 3600 of some embodiments corresponding to act 5310. In other embodiments, FIG. 43 illustrates a cross-sectional view 4300 of some embodiments corresponding to act 5310.

At act 5312, a second conductive structure is formed electrically coupled to the PCM structure and laterally spaced from the first conductive structure. In some embodiments, FIGS. 45-49 illustrate a series of cross-sectional views 4500-4900 of some embodiments corresponding to act 5312. In other embodiments, FIG. 23 illustrates a cross-sectional view 2300 of some embodiments corresponding to act 5312. In other embodiments, FIG. 29 illustrates a cross-sectional view 2900 of some embodiments corresponding to act 5312. In other embodiments, FIG. 36 illustrates a cross-sectional view 3600 of some embodiments corresponding to act 5312. In other embodiments, FIG. 43 illustrates a cross-sectional view 4300 of some embodiments corresponding to act 5312.

At act 5314, a capping structure is formed over the PCM structure, the first conductive structure, and the second conductive structure. In some embodiments, FIGS. 48-50 illustrate a series of cross-sectional views 4800-5000 of some embodiments corresponding to act 5314.

At act 5316, a second dielectric structure is formed over the capping structure. In some embodiments, FIG. 51 illustrates a cross-sectional view 5100 of some embodiments corresponding to act 5316.

At act 5318, a first conductive via is formed in the second dielectric structure and electrically coupled to the first conductive structure. In some embodiments, FIG. 51 illustrates a cross-sectional view 5100 of some embodiments corresponding to act 5318.

At act 5320, a second conductive via is formed in the second dielectric structure and electrically coupled to the second conductive structure. In some embodiments, FIG. 51 illustrates a cross-sectional view 5100 of some embodiments corresponding to act 5320.

At act 5322, a third dielectric structure is formed over the second dielectric structure, the first conductive via, and the second conductive via. In some embodiments, FIGS. 51-52 illustrate a series of cross-sectional views 5100-5200 of some embodiments corresponding to act 5322.

At act 5324, a third conductive structure is formed in the third dielectric structure and electrically coupled to the first conductive via. In some embodiments, FIG. 52 illustrates a cross-sectional view 5200 of some embodiments corresponding to act 5324.

At act 5326, a fourth conductive structure is formed in the third dielectric structure and electrically coupled to the second conductive via. In some embodiments, FIG. 52 illustrates a cross-sectional view 5200 of some embodiments corresponding to act 5326.

In some embodiments, the present application provides an integrated chip (IC). The IC comprises a dielectric structure disposed over a semiconductor substrate. A phase change material (PCM) structure is disposed on a side of the dielectric structure, wherein the PCM structure is configured to change between a first resistive state and a second resistive state. A first conductive structure is disposed on the side of the dielectric structure, wherein the PCM structure is disposed between the first conductive structure and the dielectric structure, and wherein first conductive structure is electrically coupled to the PCM structure. A second conductive structure is disposed on the side of the dielectric structure and laterally spaced from the first conductive structure, wherein the PCM structure is disposed between the second conductive structure and the dielectric structure, and wherein second conductive structure is electrically coupled to the PCM structure. A heating structure is disposed in the dielectric structure and laterally between the first conductive structure and the second conductive structure, wherein the PCM structure is disposed vertically between the heating structure and the first conductive structure and vertically between the heating structure and the second conductive structure, wherein the heating structure has a first surface and a second surface opposite the first surface, wherein the first surface faces the PCM structure, and wherein the first surface has a first width and the second surface has a second width that is greater than the first width.

In some embodiments, the present application provides an integrated chip (IC). The IC comprises a dielectric structure disposed over a semiconductor substrate. A phase change material (PCM) structure is disposed over the dielectric structure, wherein the PCM structure is configured to change between a first resistive state and a second resistive state, and wherein a relative permittivity of the dielectric structure is less than a relative permittivity of the PCM structure. A first conductive structure is disposed over and electrically coupled to the PCM structure. A second conductive structure is disposed over and electrically coupled to the PCM structure, wherein the first conductive structure and the second conductive structure are laterally spaced apart along a plane. A heating structure is disposed in the dielectric structure and laterally between the first conductive structure and the second conductive structure, wherein the PCM structure overlies the heating structure, wherein the heating structure has a first portion and a second portion, wherein the first portion is disposed vertically between the second portion and the PCM structure, wherein the first portion has a first width along the plane, wherein the second portion has a second width along the plane, and wherein the second width is greater than the first width. An insulator structure is disposed vertically between the heating structure and the PCM structure.

In some embodiments, the present application provides a method. The method comprises depositing a first heating layer over a first dielectric structure. An etch stop layer is formed over the first heating layer. A second heating layer is deposited over the etch stop layer. An insulator layer is formed over the first heating layer. A patterned masking layer is formed over the insulator layer. A first etching process is performed to etch the insulator layer and the second heating layer according to the patterned masking layer, thereby forming an insulator structure and a first portion of a heating structure. The first etching process exposes the etch stop layer. A spacer layer is deposited over the etch stop layer, the insulator structure, and the first portion of the heating structure. The spacer layer is etched, thereby forming a first spacer structure and a second spacer structure. The etch stop layer and the first heating layer are etched, thereby forming an etch stop structure and a second portion of the heating structure. A second dielectric structure is formed over the first dielectric structure, wherein the second dielectric structure is formed laterally around the insulator structure, the first portion of the heating structure, the first spacer structure, the second spacer structure, the etch stop structure, and the second portion of the heating structure. A phase change material (PCM) structure is formed over the insulator structure, the first spacer structure, the second spacer structure, and the second dielectric structure. A first conductive structure is formed over the PCM structure and the second dielectric structure, wherein the first conductive structure is formed electrically coupled to the PCM structure. A second conductive structure is formed over the PCM structure and the second dielectric structure, wherein the second conductive structure is formed electrically coupled to the PCM structure, and wherein the second conductive structure is formed laterally spaced from the first conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC), comprising:
a dielectric structure disposed over a semiconductor substrate;
a phase change material (PCM) structure disposed on a side of the dielectric structure, wherein the PCM structure is configured to change between a first resistive state and a second resistive state;
a first conductive structure disposed on the side of the dielectric structure, wherein the PCM structure is disposed between the first conductive structure and the dielectric structure, and wherein the first conductive structure is electrically coupled to the PCM structure;
a second conductive structure disposed on the side of the dielectric structure and laterally spaced from the first conductive structure, wherein the PCM structure is disposed between the second conductive structure and the dielectric structure, and wherein second conductive structure is electrically coupled to the PCM structure;
a heating structure disposed in the dielectric structure and laterally between the first conductive structure and the second conductive structure, wherein the PCM structure is disposed vertically between the heating structure and the first conductive structure and vertically between the heating structure and the second conductive structure, wherein the heating structure has a first surface and a second surface opposite the first surface, wherein the first surface faces the PCM structure, and wherein the first surface has a first width and the second surface has a second width that is greater than the first width; and
an insulator structure disposed on the first surface and between the heating structure and the PCM structure, wherein the first surface and the second surface are of a same material.

2. The IC of claim 1, wherein:
the insulator structure comprises a different material than the dielectric structure; and
the insulator structure has a third width that is substantially the same as the first width.

3. The IC of claim 1, wherein the heating structure has a T-shaped profile.

4. The IC of claim 1, wherein:
the heating structure comprises a first portion and a second portion;
the first portion is disposed vertically between the second portion and the PCM structure;
the second portion has a first sidewall and a second sidewall opposite the first sidewall of the second portion;
the first sidewall of the second portion and the second sidewall of the second portion are both substantially vertical;
the first portion has a first sidewall and a second sidewall opposite the first sidewall of the first portion;

the first sidewall of the first portion and the second sidewall of the first portion are both substantially vertical;
the heating structure has a third surface disposed vertically between the first surface and second surface;
the first sidewall of the second portion extends from the second surface to the third surface;
the first sidewall of the first portion extends from the first surface to the third surface;
the first surface extends laterally in parallel with the second surface; and
the third surface extends laterally in parallel with both the first surface and the second surface.

5. The IC of claim 1, wherein a profile of the heating structure has a trapezoid shape.

6. The IC of claim 1, wherein a profile of the heating structure has an isosceles trapezoid shape.

7. The IC of claim 1, wherein:
the heating structure has a first sidewall that extends continuously from the first surface to the second surface;
the heating structure has a second sidewall that extends continuously from the first surface to the second surface;
the first sidewall is opposite the second sidewall; and
the first sidewall and the second sidewall are both concave.

8. The IC of claim 1, wherein:
the heating structure has a first sidewall that extends continuously from the first surface to the second surface;
the heating structure has a second sidewall that extends continuously from the first surface to the second surface;
the first sidewall is opposite the second sidewall; and
the first sidewall and the second sidewall are both convex.

9. The IC of claim 1, wherein:
the heating structure comprises a first portion and a second portion;
the first portion is disposed vertically between the second portion and the PCM structure;
the second portion has a first sidewall and a second sidewall opposite the first sidewall of the second portion;
the first sidewall of the second portion and the second sidewall of the second portion are both substantially vertical;
the first portion has a first sidewall and a second sidewall opposite the first sidewall of the first portion;
the first sidewall of the first portion and the second sidewall of the first portion are both concave;
the first sidewall of the second portion extends from the second surface to the first sidewall of the first portion;
the second sidewall of the second portion extends from the second surface to the second sidewall of the first portion;
the first sidewall of the first portion extends from the first surface to the first sidewall of the second portion; and
the second sidewall of the first portion extends from the first surface to the second sidewall of the second portion.

10. The IC structure of claim 1, wherein:
the heating structure has a first length that is measured substantially perpendicular to the first width;
the insulator structure has a second length that is measured substantially perpendicular to the first width; and the second length is substantially the same as the first length.

11. An integrated chip (IC), comprising:

a dielectric structure disposed over a semiconductor substrate;

a phase change material (PCM) structure disposed over the dielectric structure, wherein the PCM structure is configured to change between a first resistive state and a second resistive state, and wherein a relative permittivity of the dielectric structure is less than a relative permittivity of the PCM structure;

a first conductive structure disposed over and electrically coupled to the PCM structure;

a second conductive structure disposed over and electrically coupled to the PCM structure, wherein the first conductive structure and the second conductive structure are laterally spaced apart along a plane;

a heating structure disposed in the dielectric structure and laterally between the first conductive structure and the second conductive structure, wherein:

the PCM structure overlies the heating structure;

the heating structure has a first portion and a second portion;

the first portion is disposed vertically between the second portion and the PCM structure;

the first portion has a first width along the plane;

the second portion has a second width along the plane;

the second width is greater than the first width; and an insulator structure disposed vertically between the heating structure and the PCM structure, wherein the insulator structure has a third width that is substantially the same as the first width.

12. The IC of claim 11, wherein:

the first portion has a first sidewall and a second sidewall opposite the first sidewall of the first portion;

the second portion has a first sidewall and a second sidewall opposite the first sidewall of the second portion;

the first sidewall of the first portion and the second sidewall of the first portion are spaced apart a first distance along the plane;

the first sidewall of the second portion and the second sidewall of the second portion are spaced apart a second distance along the plane; and the second distance is greater than the first distance.

13. The IC of claim 12, further comprising:

a first spacer structure disposed along the first sidewall of the first portion; and a second spacer structure disposed along the second sidewall of the second portion, wherein both the first spacer structure and the second spacer structure overlie the second portion, and wherein the PCM structure overlies both the first spacer structure and the second spacer structure.

14. The IC of claim 12, further comprising:

an etch stop structure disposed vertically between the first portion of the heating structure and the second portion of the heating structure.

15. The IC of claim 14, wherein:

the etch stop structure has a first sidewall and a second sidewall opposite the first sidewall of the etch stop structure;

the first sidewall of the etch stop structure and the second sidewall of the etch stop structure are spaced apart a third distance along the plane; and the third distance is substantially the same as the second distance.

16. The IC of claim 15, wherein:

the insulator structure has a first sidewall and a second sidewall opposite the first sidewall of the insulator structure;

the first sidewall of the insulator structure and the second sidewall of the insulator structure are spaced apart a fourth distance along the plane; and the fourth distance is substantially the same as the first distance.

17. The IC of claim 16, wherein:

the first conductive structure and the second conductive structure are laterally spaced apart a fifth distance along the plane; and the fifth distance is greater than the first distance; and the fifth distance is less than or equal to the second distance.

18. The IC of claim 17, further comprising:

a first spacer structure disposed along the first sidewall of the first portion; and a second spacer structure disposed along the second sidewall of the second portion, wherein the first spacer structure and the second spacer structure both overlie the second portion, and wherein the PCM structure overlies both the first spacer structure and the second spacer structure.

19. An integrated chip (IC), comprising:

a silicon substrate;

a dielectric structure disposed over the silicon substrate;

a phase change material (PCM) structure disposed over the dielectric structure, wherein a relative permittivity of the dielectric structure is less than a relative permittivity of the PCM structure;

a first conductive structure disposed over the PCM structure;

a second conductive structure disposed over the PCM structure, wherein the first conductive structure and the second conductive structure are laterally spaced apart along a plane and have nearest neighboring sidewalls spaced apart by a first opening having a first width;

a heating structure having a first portion disposed in the dielectric structure and a second portion disposed in the dielectric structure below the first portion;

an insulator structure disposed vertically between the heating structure and the PCM structure;

wherein:

the first portion of the heating structure has outer sidewalls which are spaced below the first opening and which are spaced apart by a second width that is less than the first width;

the second portion of the heating structure has outer sidewalls which are spaced below the first opening and which are spaced apart by a third width that is greater than the first width; and the insulator structure has outer sidewalls that terminate at the outer sidewalls of the first portion.

20. The IC of claim 19, further comprising:

a first spacer structure disposed along a first outer sidewall of the outer sidewalls of the first portion and separating the first outer sidewall of the first portion from the dielectric structure; and a second spacer structure disposed along a second outer sidewall of the outer sidewalls of the first portion, wherein both the first spacer structure and the second spacer structure overlie the second portion, and wherein the PCM structure overlies both the first spacer structure and the second spacer structure.

\* \* \* \* \*